(12) United States Patent
Saeki

(10) Patent No.: US 7,071,755 B2
(45) Date of Patent: Jul. 4, 2006

(54) CLOCK CONTROL CIRCUIT AND METHOD

(75) Inventor: Takanori Saeki, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 107 days.

(21) Appl. No.: 10/844,555

(22) Filed: May 13, 2004

(65) Prior Publication Data

US 2004/0207445 A1 Oct. 21, 2004

Related U.S. Application Data

(62) Division of application No. 10/330,275, filed on Dec. 30, 2002, now Pat. No. 6,771,107, which is a division of application No. 09/842,200, filed on Apr. 26, 2001, now Pat. No. 6,525,588.

(30) Foreign Application Priority Data

| Apr. 27, 2000 | (JP) | ......................................... | 2000-128424 |
| Apr. 24, 2001 | (JP) | ......................................... | 2001-126661 |

(51) Int. Cl.
*H03K 3/00* (2006.01)
*G06F 1/04* (2006.01)

(52) U.S. Cl. .......................... 327/292; 327/293; 327/295

(58) Field of Classification Search ................ 327/291, 327/292, 293, 295, 297, 141, 144; 713/401, 713/503
See application file for complete search history.

(56) References Cited

U.S. PATENT DOCUMENTS

| 4,998,262 A | 3/1991 | Wiggers | ...................... 327/293 |
| 5,361,277 A | 11/1994 | Grover | ......................... 327/144 |

(Continued)

FOREIGN PATENT DOCUMENTS

| JP | 04-229634 | 8/1992 |
| JP | 06-314970 | 11/1994 |
| JP | 09-134226 | 5/1997 |
| JP | 09-213808 | 8/1997 |
| JP | 09-258841 | 10/1997 |
| JP | 9-258841 | 10/1997 |
| JP | 09-325830 | 12/1997 |
| JP | 10-283059 | 10/1998 |
| JP | 11-4145 | 1/1999 |
| JP | 11-4146 | 1/1999 |
| JP | 11-004145 | 1/1999 |
| JP | 11-007764 | 1/1999 |
| JP | 11-353268 | 12/1999 |
| JP | 2000-099190 | 4/2000 |

OTHER PUBLICATIONS

Korean Office Action dated Jun. 27, 2003 with English translation.
Japanese Office Action dated Mar. 25, 2003 with partial translation.
"Full Swing or Partial Swing Complementary Metal–Oxide Semiconductor Driver", IBM Technical Dislcosure Bulletin, Jun. 1996.

*Primary Examiner*—Tuan T. Lam
(74) *Attorney, Agent, or Firm*—McGinn & Gibb, PLLC

(57) ABSTRACT

A clock controlling circuit and method for eliminating the delay difference in the entire clock propagation line. Circuit scale is reduced as compared to a case of using a PLL or DLL circuit. A timing averaging circuit 10 is fed with clocks from a position on a forward route $11_1$ of a direction-reversed clock propagation path, adapted for being fed with input clocks at its one end, and from a position on a return route $11_2$ corresponding to the position on the forward route $11_1$. The timing difference between these clocks is averaged to output an averaged timing difference.

11 Claims, 22 Drawing Sheets

U.S. PATENT DOCUMENTS

| | | | |
|---|---|---|---|
| 5,528,187 A | 6/1996 | Sato et al. | 327/292 |
| 5,663,661 A * | 9/1997 | Dillon et al. | 326/30 |
| 5,684,424 A * | 11/1997 | Felix et al. | 327/293 |
| 5,726,596 A * | 3/1998 | Perez | 327/292 |
| 5,896,055 A | 4/1999 | Toyanaga et al. | 327/295 |
| 5,990,721 A | 11/1999 | Mellitz | 327/292 |
| 6,111,448 A | 8/2000 | Shibayama | 327/293 |
| 6,157,238 A | 12/2000 | Na et al. | 327/297 |
| 6,191,632 B1 * | 2/2001 | Iwata et al. | 327/295 |
| 6,229,368 B1 * | 5/2001 | Lee | 327/292 |

* cited by examiner

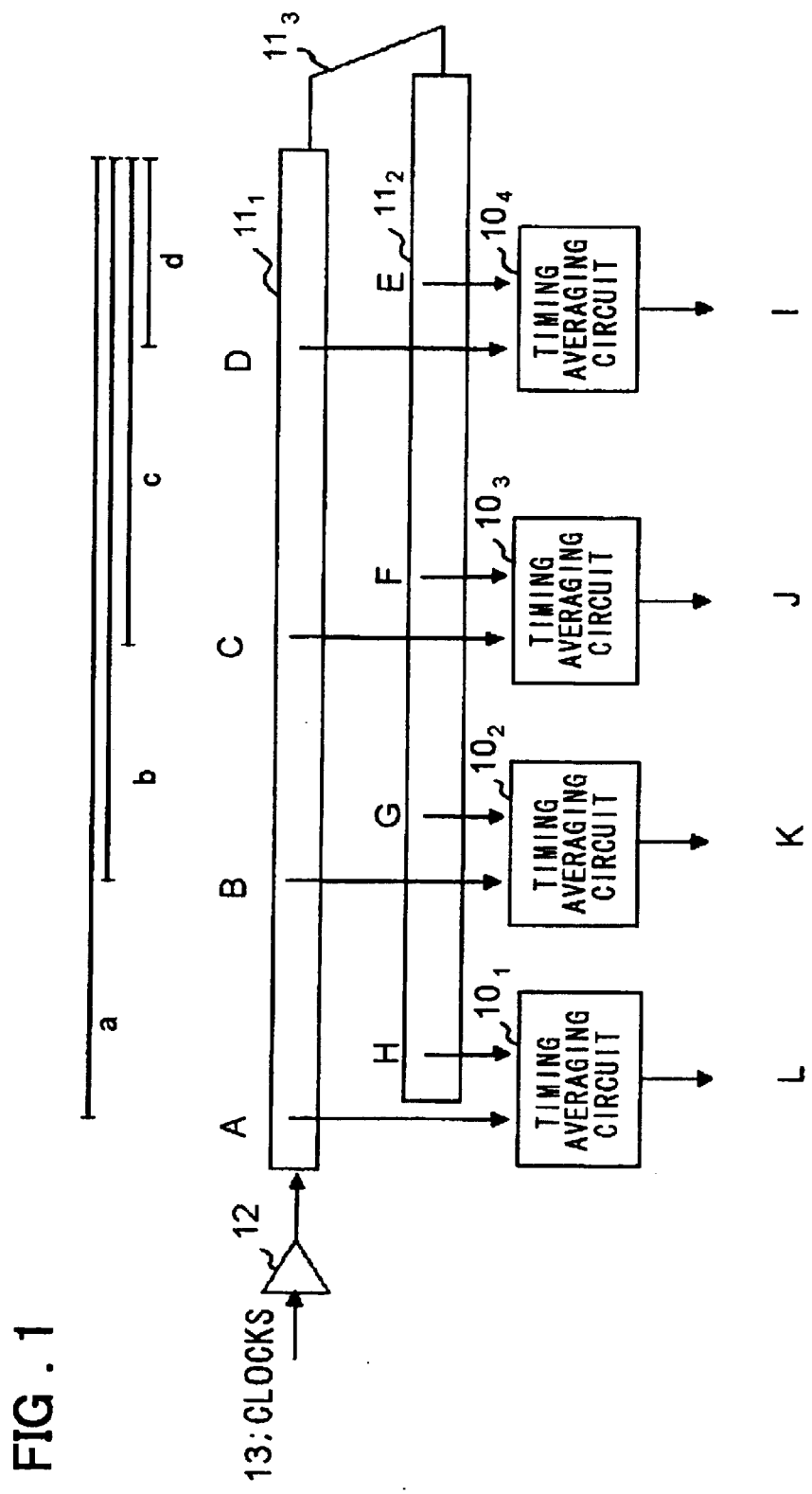

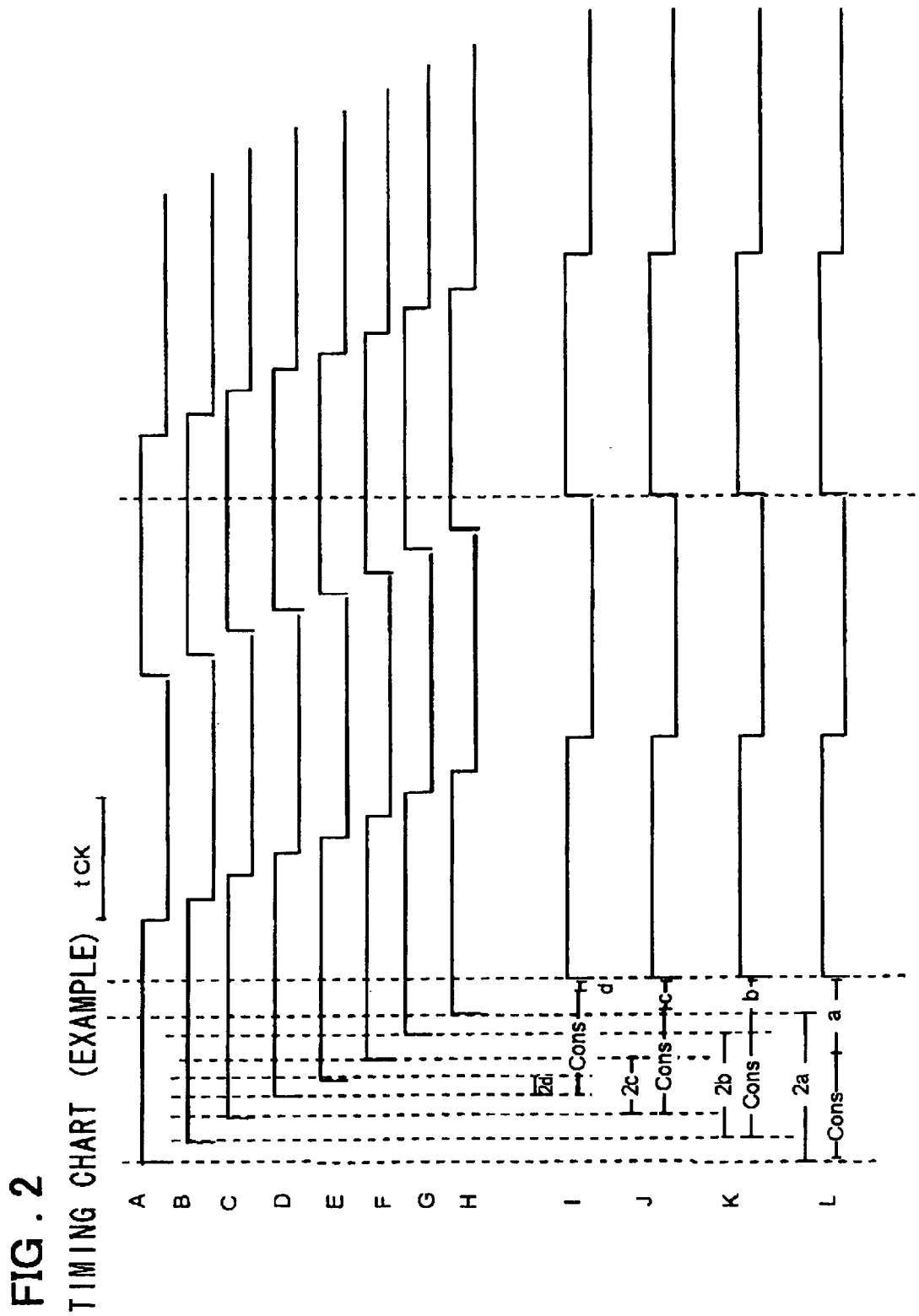

FIG. 4(c)
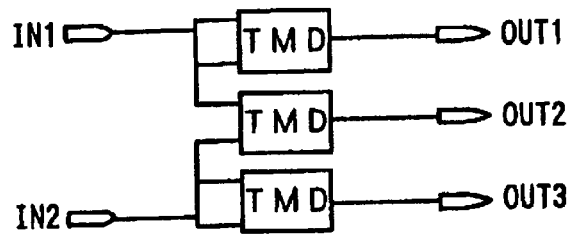
FIG. 4(d)
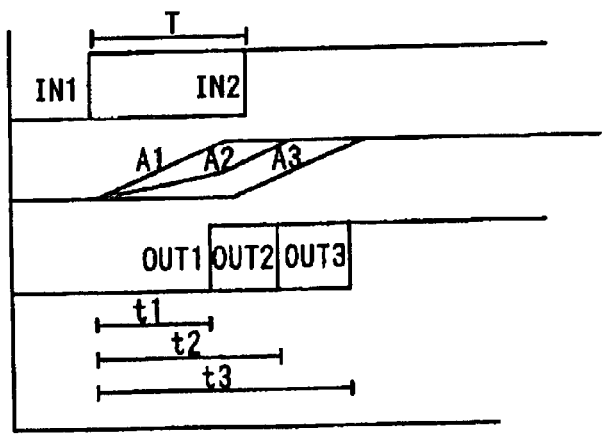
FIG. 4(e)
t1=CV/(i1+i2)
t2=T+(CV-i1T)/(i1+i2)=T+CV/(i1+i2)-i1T/(i1+i2)=T(i2/(i1+i2))+t1
t2=(1/2)T+t1
t3=T+CV/(i1+i2)=T+t1

TIMING DIFFERENCE
DIVIDING CIRCUITS 208

TIMING DIFFERENCE
DIVIDING CIRCUITS 209

TIMING AVERAGING CIRCUIT PROVIDED WITH THE FREQUENCY DIVIDING FUNCTION

TIMING CHART (EXAMPLE) tCK

TM= TIMING AVERAGING CIRCUIT

CLOCK CONTROL CIRCUIT AND METHOD

The present Application is a Divisional Application of U.S. patent application Ser. No. 10/330,275, now U.S. Pat. No. 6,771,107, filed on Dec. 30, 2002, which was a Divisional Application of U.S. patent application Ser. No. 09/842,200 filed on Apr. 26, 2001, now U.S. Pat. No. 6,525,588.

FIELD OF THE INVENTION

This invention relates to a clock controlling circuit and a clock controlling method. More particularly, it relates to a clock controlling circuit and a clock controlling method usable with advantage in a clock supplying circuit of a semiconductor integrated circuit having a circuit synchronized with system clocks.

BACKGROUND OF THE INVENTION

In a semiconductor integrated circuit controlling the internal circuit in synchronism with system clocks, preset circuit operations are executed each clock period to control the internal circuit in its entirety. Recently, the chip size is increased in keeping pace with the tendency towards the increasing degree of integration and towards the higher function of the function of the semiconductor integrated circuit. On the other hand, as the clock period becomes shorter with the increasing operating frequency, the shortening of the delay time difference in the clock path is presenting problems.

In order to cope with this task, there is disclosed in, for example, the JP Patent Kokai JP-A-9-258841 a clock supplying method in which there are provided an oncoming clock line and an outgoing clock line, these clock lines are divided into two lines of forward and return paths, and in which the wiring delay is detected to adjust clocks. There is disclosed a configuration comprising a receiver having first and second input terminals at a first position on the forward path and a second position near the first position on the forward path, respectively. The delay in the forward path and return path is detected from these first and second input terminals to output an average value of the delay caused in the forward and return paths.

That is, in the JP Patent Kokai JP-A-9-258841, a point A of a forward route 111, as an input, is coupled to an end of a phase detection circuit 181 through a variable delay line 171 and a variable delay line 172, a point H of a return route 112, as an input, is coupled to the other end of the phase detection circuit 181, the delay time of the variable delay lines 171, 172 is variably controlled for phase adjustment, and an output of a receiver is derived from a junction point of the variable delay lines 171, 172.

Since the delay time from the point A of the forward route 111 of the clock propagation path up to a turning point 113 is a, the delay time from the point A to the point H is 2a, an average value of the delay time between the points A and H is a, the delay time from the point b of the forward route 111 of the clock transmitting line to the turning point 113 is b and the delay time from the point B to the point G is 2b. So, the sum of the delay time (a−b) from the input end to the point b and the delay time ((a−b)+(a−b)+2b) from the input end to the point G is {(a−b)+((a−b)+(a−b)+2b)} is 2a, with an average value being a. In this manner, clock signals with the corresponding phase can be obtained without dependency on the positions of the clock propagation path.

In this manner, in the conventional method disclosed in the JP Patent Kokai JP-A-9-258841, a clock path is direction-reversed and a delay timing of an intermediate point between the forward and return routes is taken to adjust the delay amount of the variable delay line in the clock path.

For adjusting the delay in this manner, a feedback circuit loop, exemplified by a phase locked loop (PLL) or a delay lock loop (DLL), in which the phase difference is detected by a phase detection circuit and the delay caused in the variable delay line is varied based on the detected phase difference, is routinely used.

SUMMARY OF THE DISCLOSURE

However, the PLL or DLL, constituting a feedback circuit, presents a problem that a period longer by about hundreds to thousands of cycles is needed until clock stabilization is achieved.

There is also raised a problem that plural sets of the phase comparators and delay circuit lines are needed thus increasing the circuit scale.

In view of the aforementioned problems, it is an object of the present invention to provide a clock controlling circuit and a clock control method for a circuit for eliminating the delay difference in the entire clock transmitting line, according to which the delay difference may be eliminated in a shorter time than the case where the PLL circuit or the DLL circuit is used.

It is another object of the present invention to provide a clock controlling circuit and a clock control method according to which a phase comparator may be eliminated to prevent the circuit scale from increasing.

According to a first aspect of the present invention, there is provided a clock controlling circuit comprising:

a timing difference dividing circuit for receiving a clock at a first position on a forward route of a clock propagation path direction-reversing input clocks fed at one end thereof, and a clock at a second position on a return route thereof corresponding to the first position on the forward route, the timing difference dividing circuit outputting a signal of a delay time corresponding to a time obtained on dividing a timing difference of the two clocks by a preset interior division ratio.

According to a second aspect of the present invention, there is provided a clock controlling circuit comprising:

a timing difference averaging circuit for receiving a clock at a first position on a forward route of a clock propagation path direction-reversing input clocks fed at one end thereof, and a clock at a second position on a return route thereof corresponding to the first position on the forward route, the timing difference dividing circuit outputting a signal of a delay time corresponding to a time obtained on evenly dividing a timing difference of the two clocks.

According to a third aspect of the present invention, the timing averaging circuit is configured to issue an output signal with a delay time equal to the sum of a first delay time until output signal is issued after one of the two input clocks undergoing transition at an earlier time point is input simultaneously to first and second inputs adapted for being fed with the two clocks and a second delay time corresponding to a time (T/2) obtained on dividing the timing difference T of said two clocks into two equal portions.

According to a fourth aspect of the present invention, there is provided a timing averaging circuit fed with clocks from a first position on a forward route of a clock propagation path, adapted for direction-reversing clocks frequency divided by a frequency dividing circuit and input at an end of the clock propagation path and from a second position on a return route thereof corresponding to the first position on the forward route, and a multiplication circuit for multiplying an output of the timing averaging circuit.

According to a fifth aspect of the present invention, there is provided a clock controlling circuit comprising:

a timing averaging circuit provided with a frequency dividing function for frequency dividing two, first and second, clocks, i.e., the first clock from a first position on a forward route of a clock propagation path fed with input clocks at one end and direction-reversing the input clocks and the second clock from a second position corresponding to the first position to generate frequency divided multi-phase clocks of plural different phases, the timing averaging circuit outputting a signal of a delay time corresponding to a time equally dividing a timing difference between frequency divided clocks having a corresponding phase among clock signals obtained on frequency division of the two clocks; and a synthesis circuit for synthesizing plural outputs of the timing averaging circuits into one signal and for outputting the one signal.

According to a sixth aspect of the present invention, there is provided a clock controlling method, averages the timing difference of clocks taken from a first position on a forward route of a clock propagation path fed with input clocks at one end and direction-reversing the input clocks and from a second position on a return route corresponding to the first position on the forward route to generate a clock or clocks with matched clock timing irrespective of the clock taking positions on the forward and return route.

Other aspects and features of the present invention are disclosed also in the claims, the entire disclosure thereof being incorporated herein by reference thereto.

BRIEF DESCRIPTION OF THE DRAWINGS

FIG. 1 shows the structure of an embodiment of the present invention.

FIG. 2 is a timing chart for illustrating the operation of the embodiment of the present invention.

FIG. 4 shows the operation of a timing averaging circuit embodying the present invention.

PREFERRED EMBODIMENTS OF THE INVENTION

A preferred embodiment of the present invention is explained. In its preferred embodiment, shown in FIG. 1, the present invention includes a timing averaging circuit which is fed with clocks from a first position on a forward route of a clock propagation path adapted for being fed with input clocks at one end and direction-reversing the input clocks and from a second position on a return route corresponding to the first position on the forward route and which divides the timing difference of these clocks into two equal portions to output the resulting clocks. The delay time between the first position and the direction-reversing point $11_3$ of the clock propagation path is equal to the delay time between the direction-reversing point $11_3$ of the clock propagation path and the second position.

The timing averaging circuit issues an output signal with a delay time equal to the sum of a (first) delay time (Cons) until outputting of an output signal after one of the two input clocks undergoing transition at an earlier time is input simultaneously to the first and second input ends fed with the two clocks and a (second) delay time corresponding to a time (T/2) obtained on dividing the timing difference T of the two clocks into two equal portions. Namely, the present invention does not use PLL nor DLL. The timing averaging circuit is configured so that the internal node is charged or discharged, based on one of two input clocks that undergoes an earlier transition and so that the internal load is charged or discharged based on the other clock undergoing be later transition and the aforementioned one clock. The internal node is connected to the input end. There is provided an inverting or non-inverting buffer circuit an output logical value of which is changed when the internal node voltage becomes higher or lower than a threshold voltage.

Figure 5:
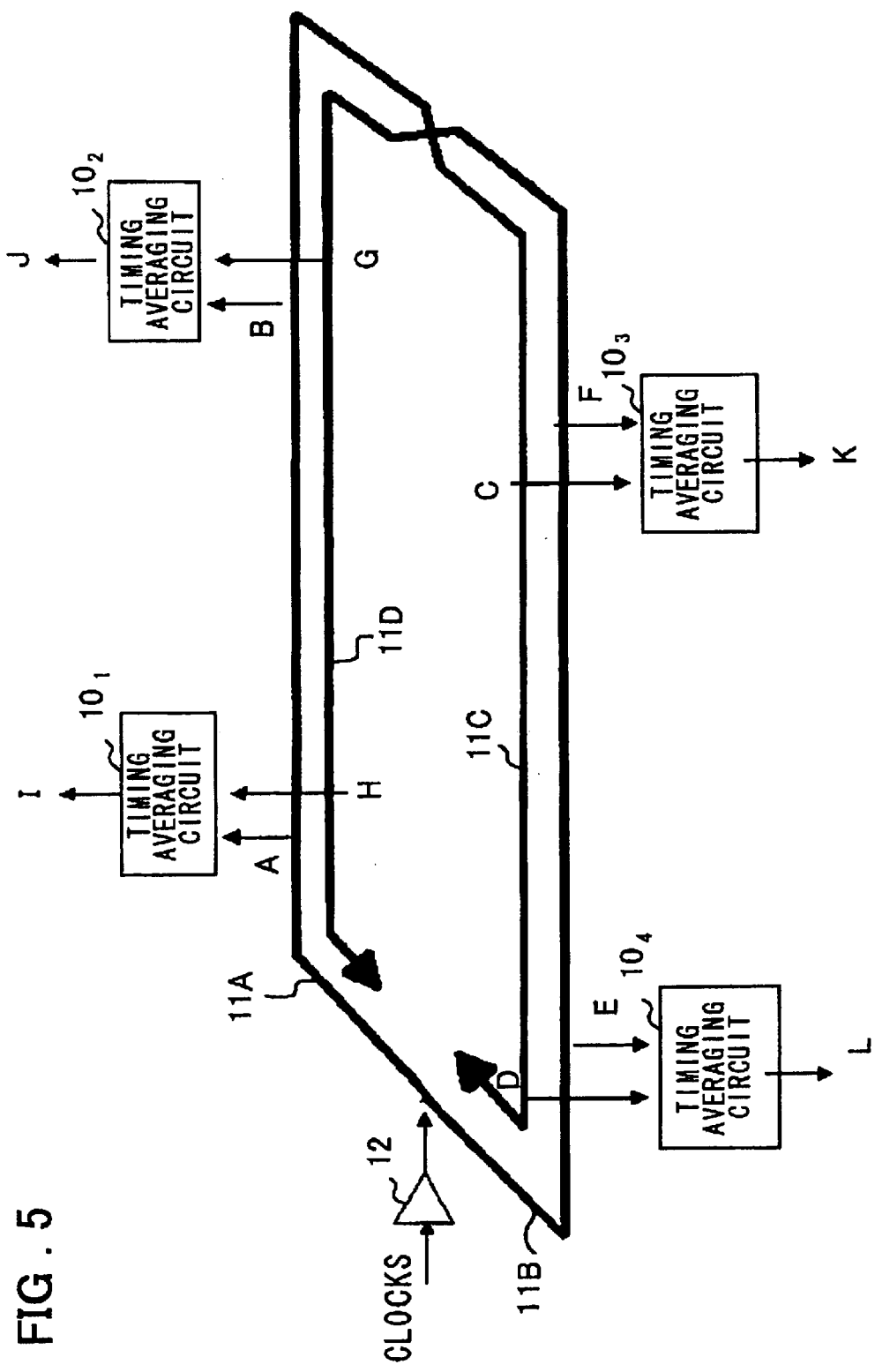
FIG. 5 shows the structure of a second embodiment of the present invention.

In its preferred embodiment of the present invention, shown in FIG. 5, input clocks are input from one end of a clock propagation path and branches to first and second forward routes (11A, 11B), with the first and second forward routes being direction-reversed (preferably, in a crossing-fashion) on an opposite end to the said one end, with the return routes (11C, 11D) of the first and second routes thus direction-reversed being arranged along the forward routes (11A, 11B) of the second and first routes. The clock controlling circuit includes timing averaging circuits $10_1$, $10_2$ for being fed with a clock from first positions (A, B) on the forward route 11A of the first route and with a clock from the second position (C, D) on the return route 11D of the second route for outputting a signal of delay time corresponding to the time averaging a timing difference between the clocks in two equal portions, and timing averaging circuits $10_4$, $10_3$ for being fed with clocks from third positions E, F on a forward route $11b$ of the second route and from fourth positions D, C on the return route 11C of the second route to average out the timing difference of these clocks to output the resulting clocks.

Figure 9:
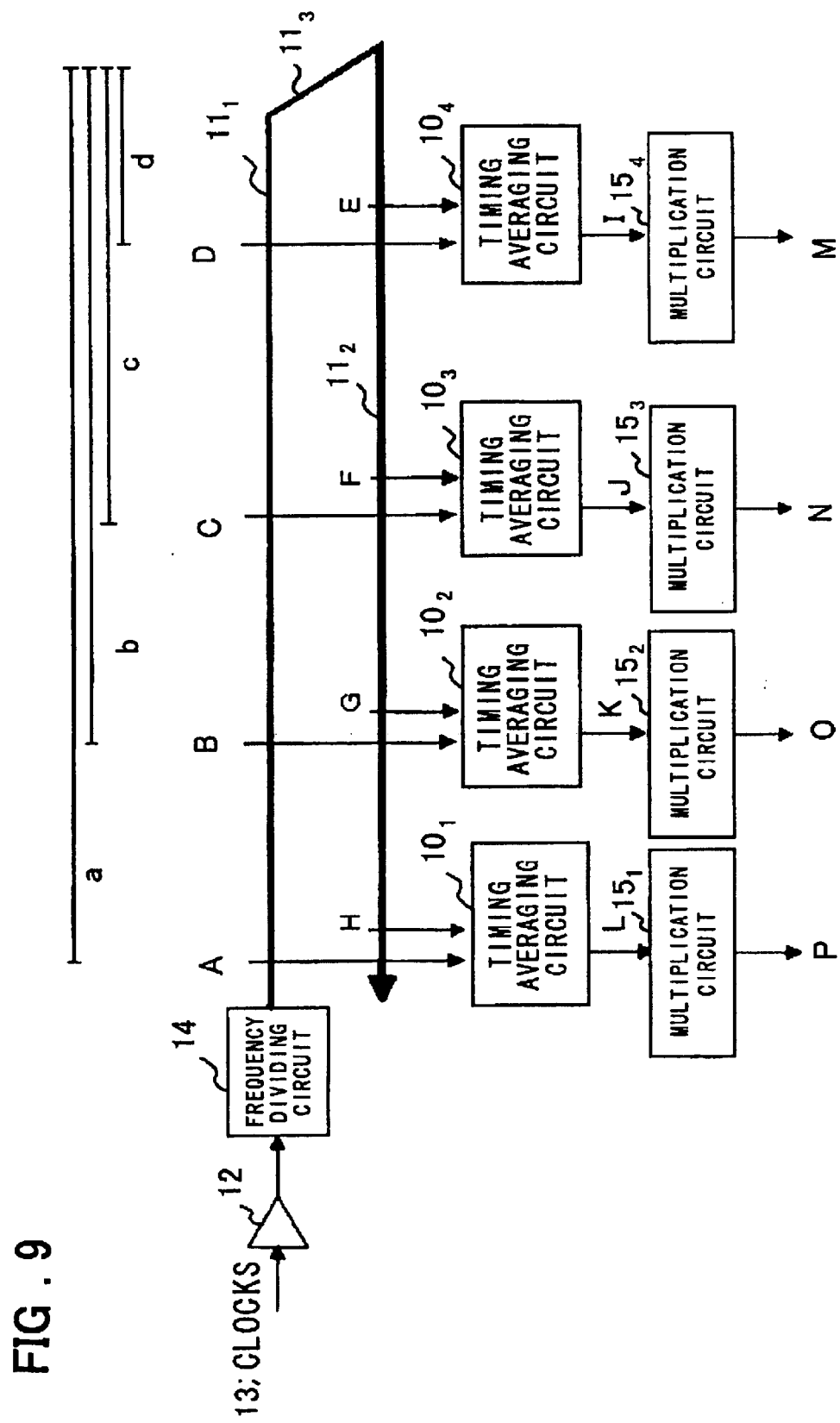
FIG. 9 shows the structure of a third embodiment of the present invention.

In a preferred embodiment of the present invention, shown in FIG. 9, there are provided a frequency dividing circuit 14 for frequency dividing input clocks, timing averaging circuits $10_1$, $10_2$, $10_3$, $10_4$ for being fed with clocks from first positions A, B, C and D on a forward route of a clock propagation path adapted for being fed with clocks frequency divided by the frequency dividing circuit, the path direction-reversing the clocks, and second positions H, G, E and F on a return route corresponding to the first position on the forward route, the timing averaging circuit outputting a signal of a delay time corresponding to a time dividing a timing difference of these clocks in two equal portions, and multiplication circuits $15_1$, $15_2$, $15_3$, $15_4$ for multiplying an output signal from the timing averaging circuits $10_1$, $10_2$, $10_3$, $10_4$ and outputting a multiplied output signal.

Figure 16:
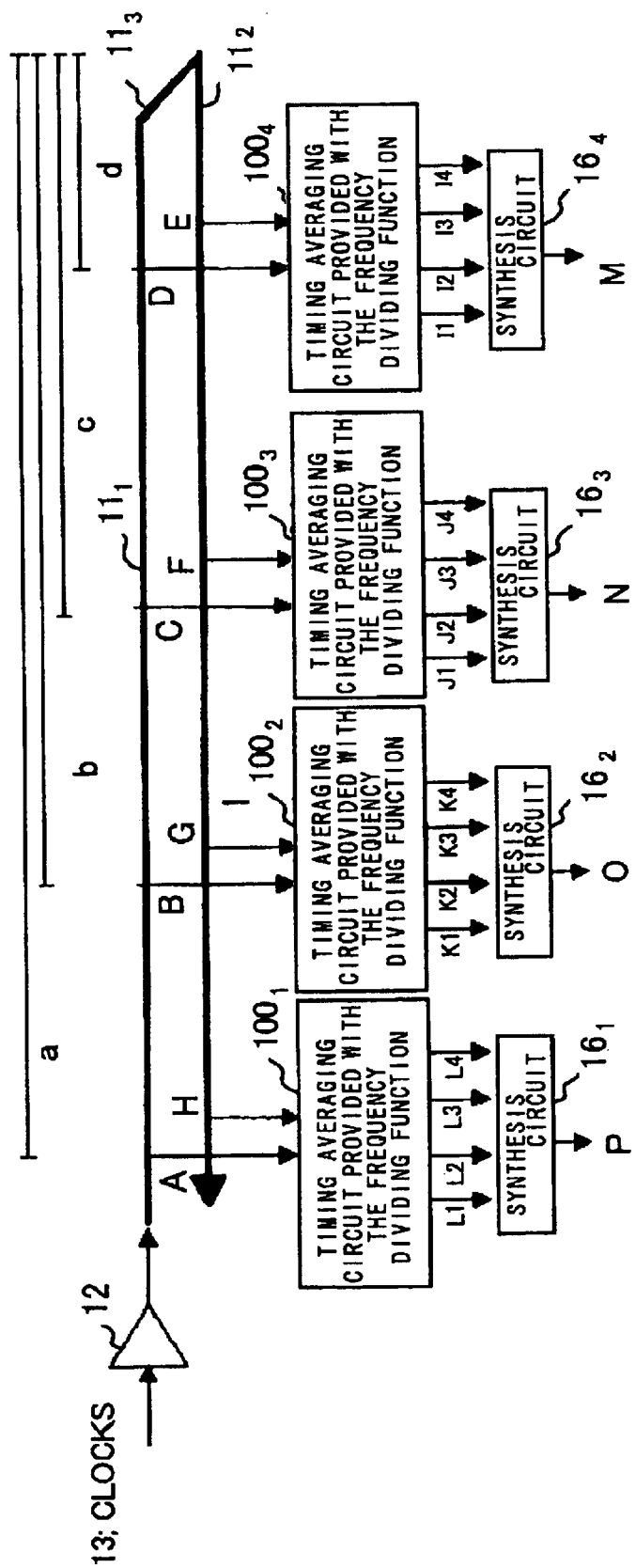
FIG. 16 shows a structure of a fourth embodiment of the present invention.

In a preferred embodiment of the present invention, shown in FIG. 16, there are provided timing averaging circuits provided with frequency dividing functions (function units) $100_1$ to $100_4$ fed with two clocks from first positions A, B, C and D on a forward route $11_1$ of the clock propagation path and from second positions H, G, F, E corresponding to the first positions on the forward route, and synthesis circuits $16_1$ to $16_4$ for synthesizing plural outputs (L1 to L4, K1 to k4, J1 to J4 and I1 to I4)of the timing averaging circuits provided with the frequency dividing function $100_1$ to $100_4$ into one signal and for outputting the one signal.

The timing averaging circuit provided with the frequency dividing function has first and second frequency dividing circuits $101_1$, $101_2$ for frequency dividing two clocks to output plural frequency divided clocks having respective different phases, a plurality of timing averaging circuits $102_1$ to $102_4$ for being fed with two frequency divided clocks of the first and the second frequency dividing circuits having corresponding phases and a synthesis circuit 16 for synthesizing plural outputs L1 to L4 of the timing averaging circuits $102_1$ to $102_4$ into one signal.

Figure 19:
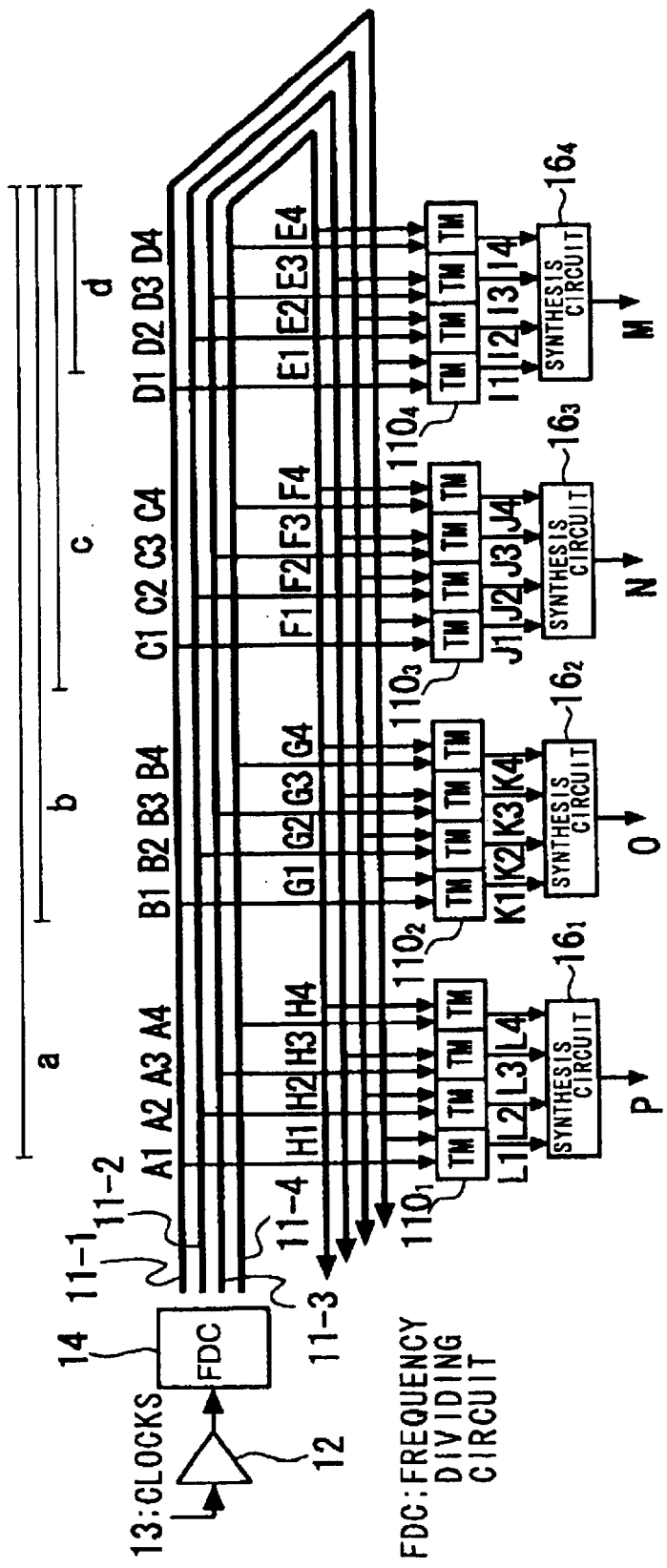
FIG. 19 shows a structure of a fifth embodiment of the present invention.

In a preferred embodiment of the present invention, shown in FIG. 19, there are provided a frequency dividing circuit 14A for frequency dividing input clocks for outputting frequency divided clocks of plural different phases, a plurality of clock propagation paths 11-1 to 11-4 for being fed at one end with a plurality of frequency divided clocks output from the frequency dividing circuit, a plurality of timing averaging circuits (four TMs) for being fed with two clocks from a first position on the forward route and from a second position on a return route associated with the first position, for each of the plural clock propagation paths, to output signals of delay time corresponding to the time resulting from division of a timing difference of the two clocks into two equal portions, and a synthesis circuit 16 for synthesizing plural outputs of the plural timing averaging circuits (four TMs).

Figure 21:
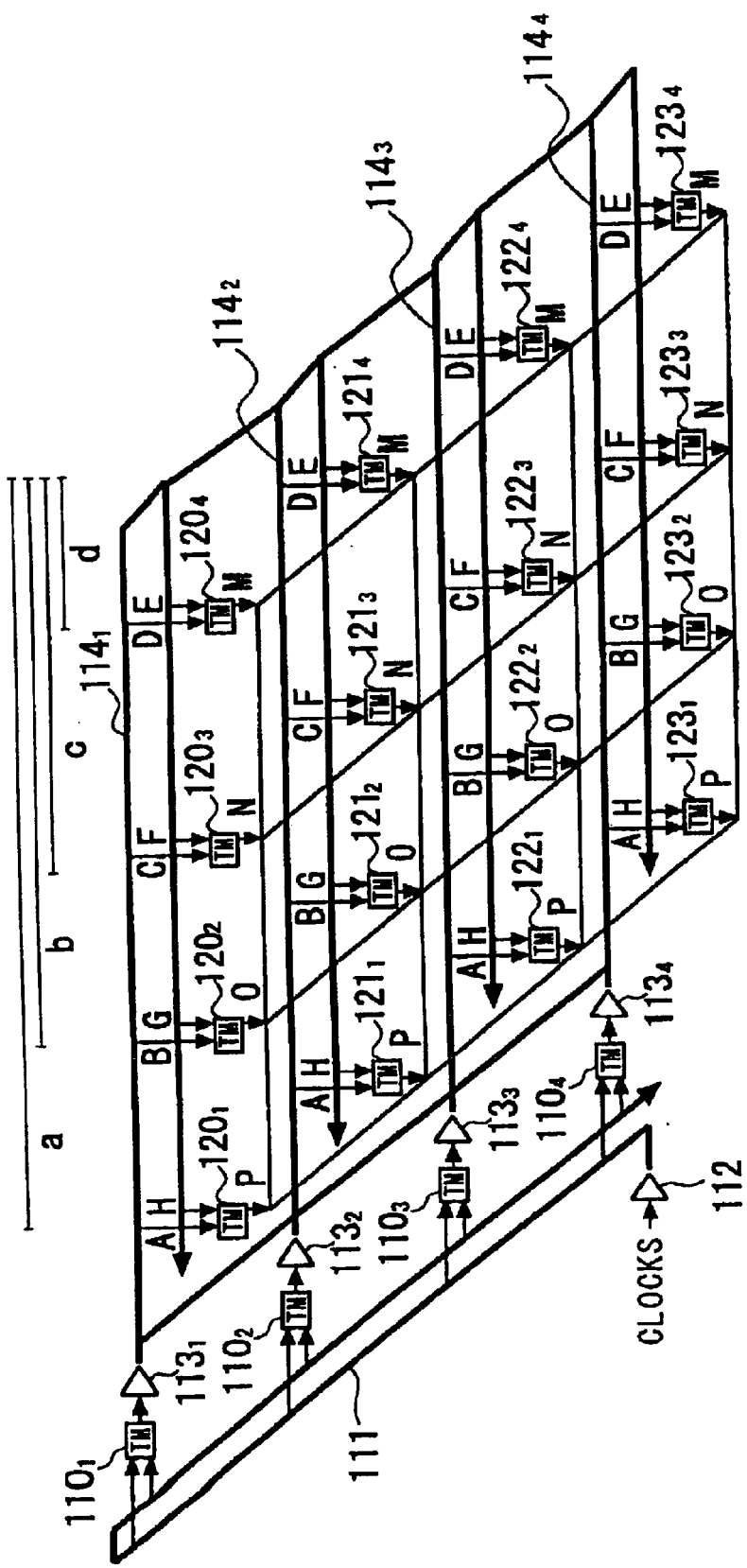
FIG. 21 shows a structure of the fifth embodiment of the present invention.
Figure 22:
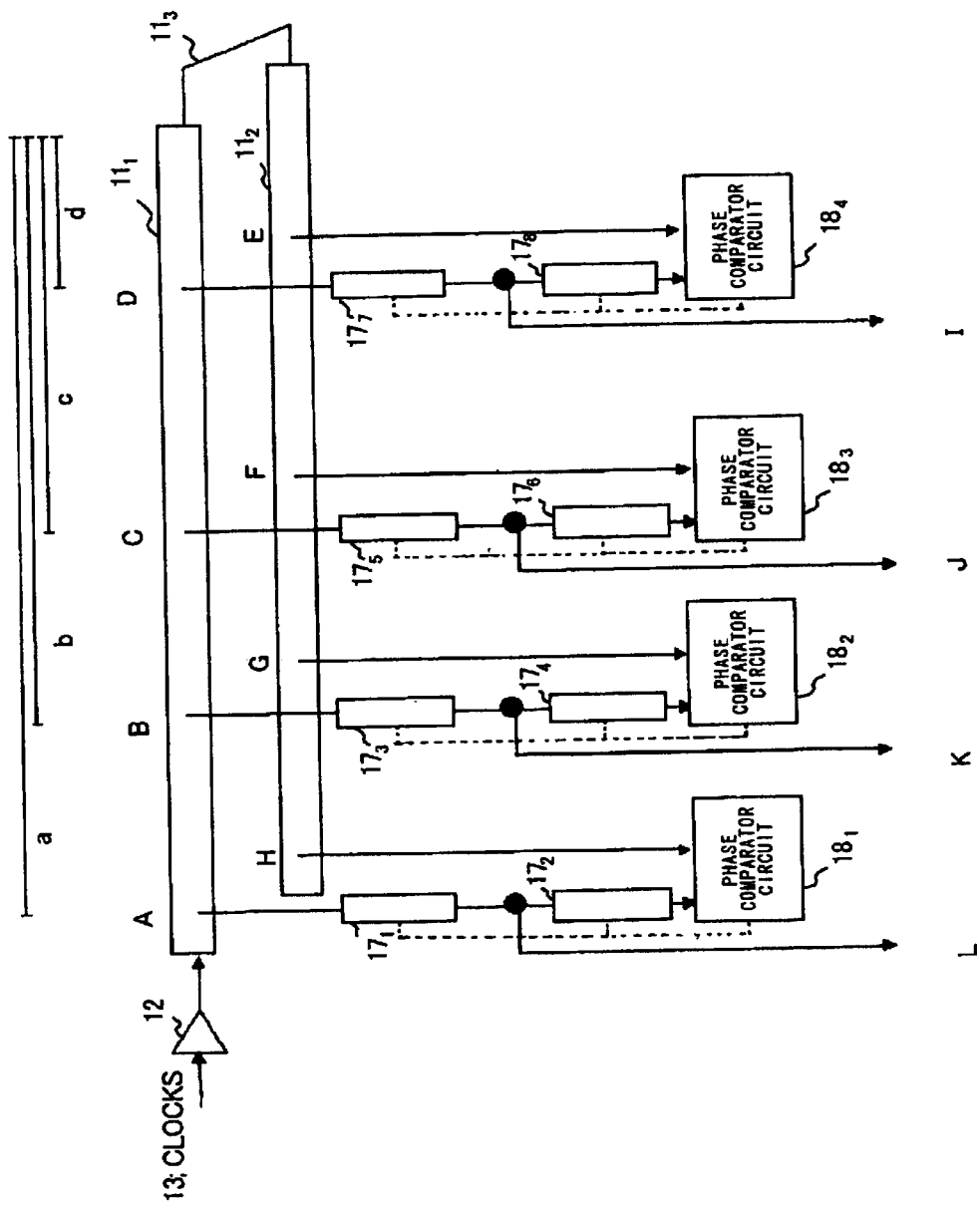
FIG. 22 shows an exemplary structure of a conventional clock controlling circuit.

In a preferred embodiment of the present invention, shown in FIG. 21, there are provided timing averaging circuits $101_1$ to $110_4$ for being fed with two clocks from first positions A to D on a forward route of a clock propagation path 111, and from second positions H, G, F and E on the return route corresponding to the position on the forward route, and timing averaging circuits $120_1$ to $120_4$ for being fed with two clocks from a certain position on the forward route of the second clock propagation path $114_1$, and from a position on the return route corresponding to the position on the forward route.

There are also provided timing averaging circuits $121_1$ to $121_4$ for being fed with two clocks from a certain position on a forward route of a second clock propagation path $114_2$, fed with clocks output from the timing averaging circuits $110_2$ at one end for direction-reversing the clocks and from a position on the return route corresponding to the position on the forward route, timing averaging circuits $122_1$ to $122_4$ for being fed with two clocks from a certain position on a forward route of a second clock propagation path $114_3$, fed with clocks output from the timing averaging circuits $110_3$ at one end for direction-reversing the clocks, and from a position on the return route corresponding to the position on the forward route, and timing averaging circuits $123_1$ to $123_4$ for being fed with two clocks from a certain position on a forward route of a second clock propagation path $114_4$, and from a position on the return route corresponding to the position on the forward route. The output signals of these timing averaging circuits are arranged e.g., in a mesh-like fashion on a two-dimensional plane of a semiconductor integrated circuit or a printed wiring board.

A few circuit configurations of the timing averaging circuits are hereinafter explained. The timing averaging circuit in a preferred embodiment of the present invention for being fed with clocks on forward and return routes of the direction-reversing type clock propagation path, shown in FIG. 3, includes first and second switch elements MP1, MP2 connected in parallel across the first power source and an internal node and which are turned on and off when the first and second inputs IN1, IN2 are at first and second values, respectively, a third switch element MN1 connected across the internal node N1 and a second power source GND, the third switch element being fed on a control terminal with an output of a logic circuit NOR fed with the first and second inputs, and being turned on when the first and second inputs are at the second value, a capacitance C connected across the internal node N1 and a second power source GND and a buffer circuit BUT an output logical value of which is determined based on the relative magnitudes of the potential of the internal node N1 and the threshold value.

Figure 6:
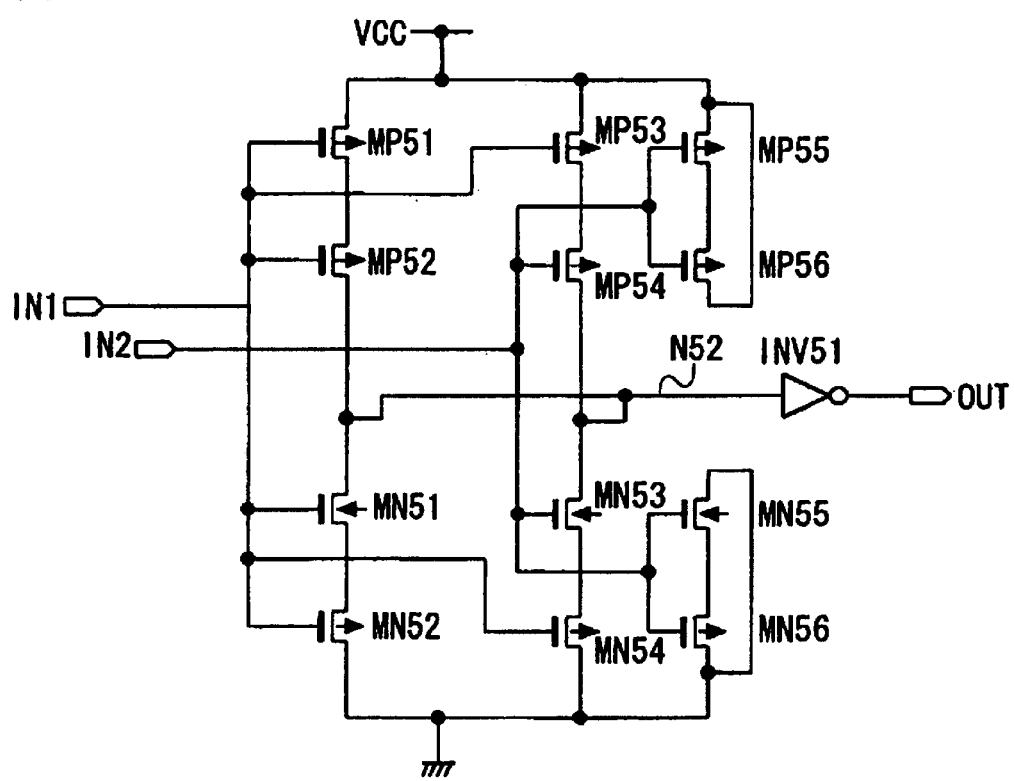
FIG. 6 shows the structure of another exemplary timing averaging circuit embodying the present invention.

In a preferred embodiment of the present invention, shown in FIG. 6, the timing averaging circuit includes a plurality of first switch elements MP1, MP2 connected in series across a first power source VCC and an internal node N52, the timing averaging circuit having its control terminal fed with a first input IN1 and being turned off when the first input IN1 is at a first value, a plurality of second switch elements MN51, MN52 connected in series across the internal node N52 and a second power source GND, each second switch element having its control terminal connected to the first input IN1 and being turned on when the first input IN1 is at a first value, a third switch element MP53 connected in series across the first power source and a second power source N52, the fourth switch element having its control terminal connected to the first input IN1, and being turned off when the first input IN1 is at a first value, a fourth switch element MP54 having its control terminal connected to the second input IN2 and being turned off when the second input IN2 is at a first value, a fifth switch element MN54 connected in series across the internal node N52 and the second power source, the fifth switch element having its control terminal connected to the first input, and being turned on when the first input is at a first value, and a sixth switch element MN53 having its control terminal connected to the second input and being turned on when the second input is at the first value and an inverter circuit INV51 an output logical value of which is determined based on the relative magnitudes of the internal node and a threshold value. The switch elements MP55, MP56, control terminals which are connected to the second input, are connected to the first power source, the switching elements MN55 MN56, control terminals which are connected to the second input, are connected to the second power source and the numbers of the switch elements operating as loads for the first and second inputs are equal each other.

Figure 7:
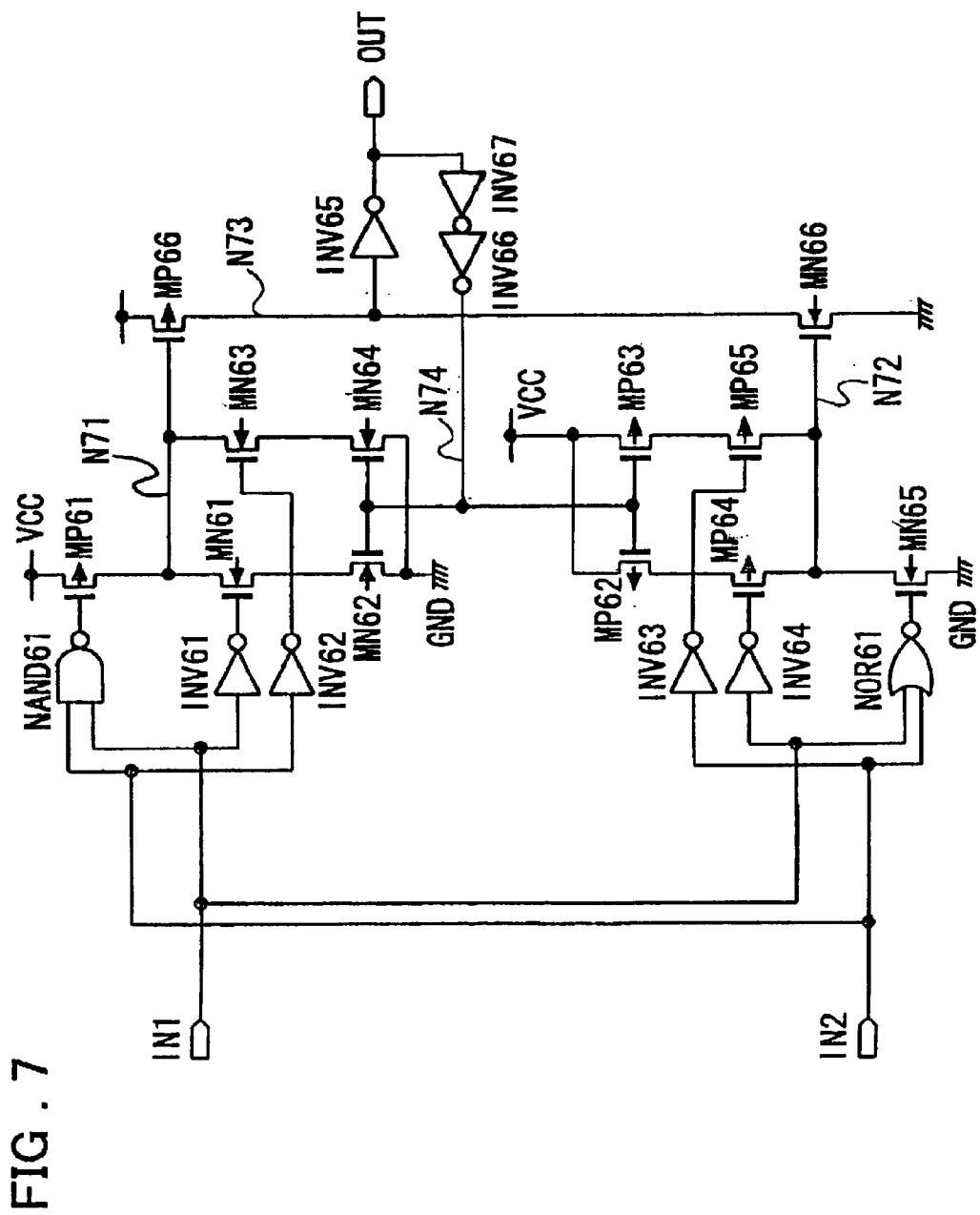
FIG. 7 shows the structure of another exemplary timing averaging circuit embodying the present invention.

In a preferred embodiment of the present invention, shown in FIG. 7, the timing averaging circuit includes a first switch element MP61 connected across the first power source VCC and a first internal node N71, a first logical circuit NAND 61 fed with first and second input signals IN1, IN2 from an input end and having its output end connected to a control terminal of the first switch element MP61, the first switch element being turned on when both the first and second input signals are at a first value, a second switch element MN61 connected in series across the first internal node N71 and the second power source GND and being turned off or on when the first input signal is at the first or second value, respectively, a third switch element MN62 turned on or off when an output signal OUT is at the first or second value, respectively, a fourth switch element MN63 connected in series across the first internal node N71 and the second power source and being turned off or on when the first input signal is at the first or second value, respectively, a fifth switch element MN64 turned on or off when an output signal OUT is at the first or second value, respectively, and a sixth switch element MP66 connected across the first power source and a third internal node N73 for inputting the first internal node N71 to a control terminal.

The timing averaging circuit also includes a seventh switch element MN65 connected across the second power source GND and the second internal node N72, a second logical circuit NOR61 fed with first and second input signals IN1, IN2 and having its output end connected to a control terminal of the seventh switch element MN65, the seventh switch element MN65 being turned on when both the first and second input signals IN1, IN2 are at a second value, an eighth switch element MP64 connected in series across the second internal node N72 and the first power source VCC and being turned on or off when the first input signal is at the first or second value, respectively, a ninth switch element MP62 turned off or on when an output signal is at the first or second value, respectively, a tenth switch element MP65 connected in series across the second internal node N72 and the first power source VCC and being turned on and on when the second input signal is at the first or second value, respectively, an eleventh switch element turned off or on when the output signal is at the first or second value, respectively, a twelfth switch element MP63 connected across the second power source and the third internal node for inputting the second internal node to a control terminal and an inverter circuit INV65 having its input terminal fed with the third internal node and an output logical value of which is determined by the relative magnitudes of the third internal node potential and a threshold value. The clock control circuit further includes circuit means for on/off controlling a first switch element pair made up of the third switch element MN65 and the fifth switch element MN64 and a second switch element pair made up of the ninth switch element MP62 and the eleventh switch element MP63.

The circuit means may, for example, be buffer circuits INV67, INV66 for generating normal signals of an output signal prescribed by the first and second input signals IN1, IN2. An output of the buffer circuit is connected in common to control terminals of the fifth switch element MN65, fifth switch element MN64, ninth switch element MP62 and the eleventh switch element MP63.

Figure 8:
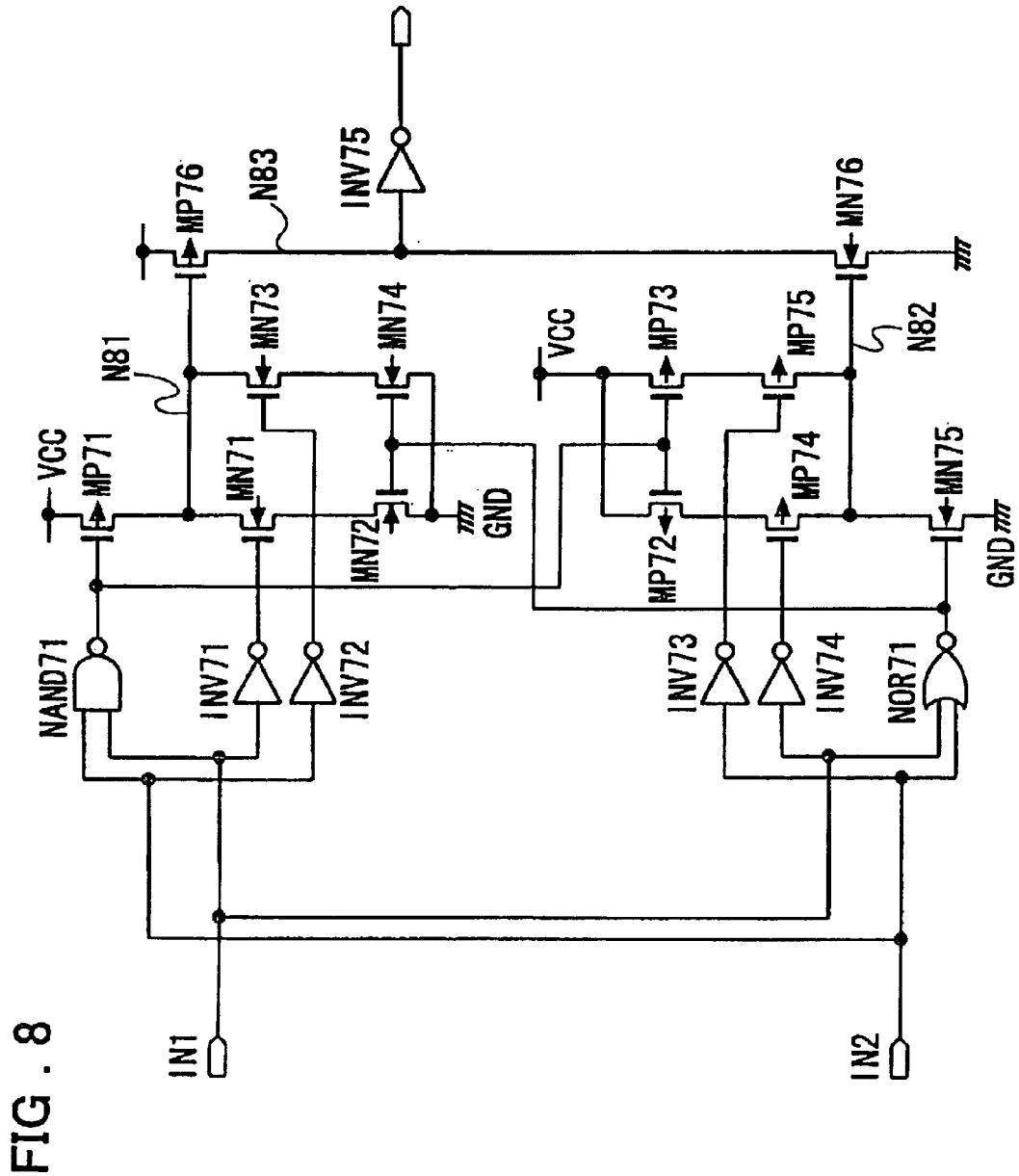
FIG. 8 shows the structure of another exemplary timing averaging circuit embodying the present invention.

In a preferred embodiment of the present invention, shown in FIG. 8, the timing averaging circuit includes a first switch element MP71 connected across the first power source and a first internal node N81, a first logical circuit NAND71 fed with first and second input signals and having its output end connected to a control terminal of the first switch element MP71, the first switch element MP71 being turned on when both the first and second input signals are at a first value, second and third switch elements MN71, MN72 connected in series across the first internal node N81 and the second power source, with the second switch element MN71 being turned off or on when the first input signal is at the first or second value, respectively. The timing averaging circuit also includes a sixth switch element MP76 connected across the first power source and a third internal node N83 for inputting the first internal node N81 to a control terminal.

The timing averaging circuit also includes a seventh switch element MN75 connected across the second power source GND and the second internal node N82, a second logical circuit NOR71 fed with first and second input signals IN1, IN2 and having its output end connected to a control terminal of the eleventh switch element MP72, MP73, the seventh switch element being turned on when both the first and second input signals are at a second value, eighth and ninth switch elements MP74, MP72 connected in series across the second internal node N82 and the first power source and being turned on or off when the first input signal is at the first or second value, respectively, a ninth switch element turned off or on when an output signal is at the first or second value, respectively, tenth and eleventh switch elements MP75, MP73 connected in series across the second internal node N82 and the first power source and being turned on or off when the first input signal is at the first or second value, respectively, a twelfth switch element MN76 connected across the second power source and the third internal node N83 for inputting the second internal node to a control terminal and an inverter circuit INV75 having its input terminal fed with the third internal node N83 and an output logical value of which is determined by the relative magnitudes of the third internal node potential and a threshold value.

An output of the first logical circuit NAND71 is connected in common to control terminals of the ninth switch element MP72 and the eleventh switch element MP73, whilst an output of the second logical circuit NOR71 is connected in common to control terminals of the third switch element MN72 and the fifth switch element MN73.

Figure 11:
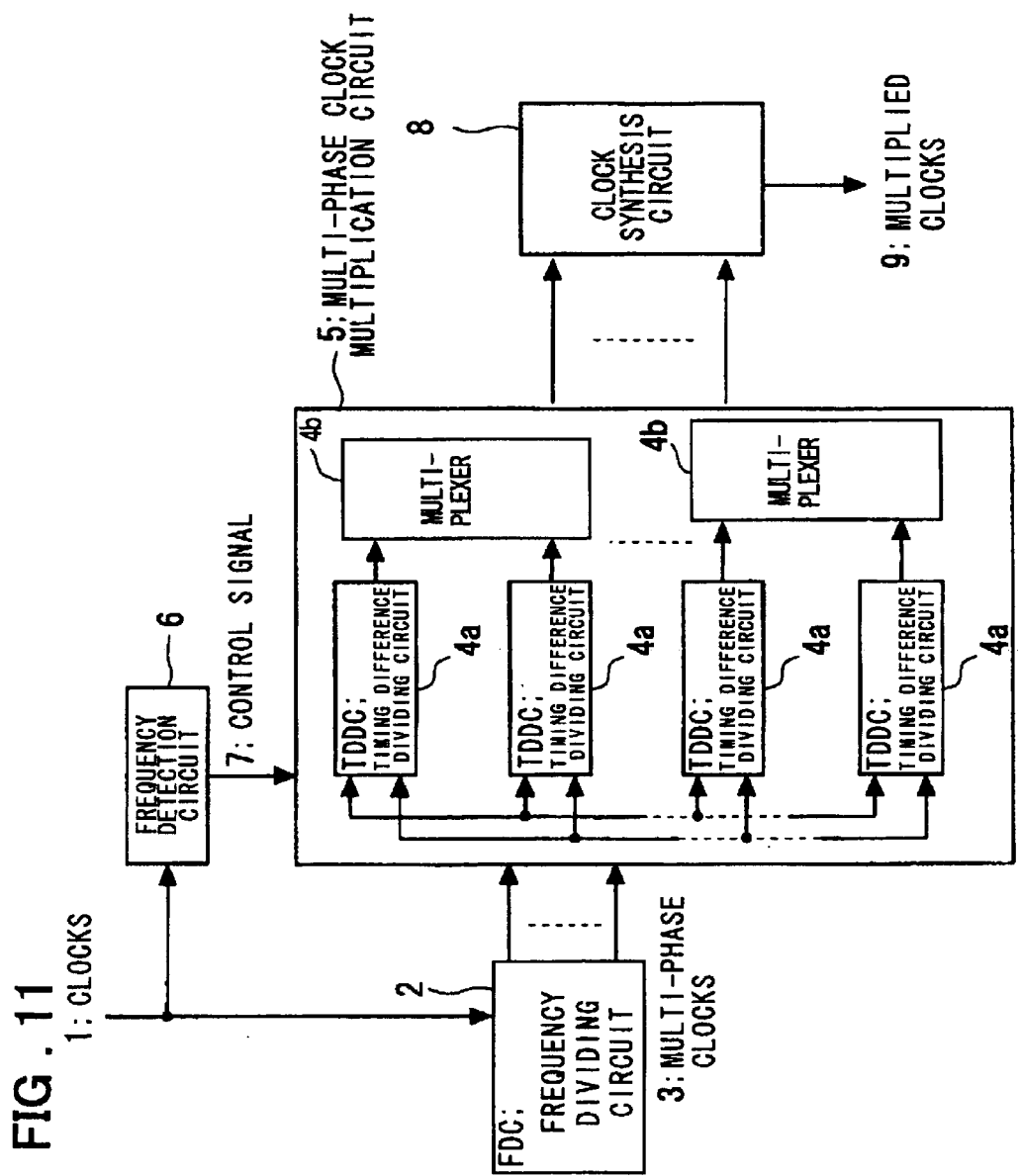
FIG. 11 shows an exemplary structure of a multiplication circuit of the third embodiment of the present invention.

In a preferred embodiment of the present invention, shown in FIG. 11, the structure of multiplication circuits $15_1$ to $15_4$ includes a frequency dividing circuit 2 for frequency dividing input clocks for generating and outputting plural clocks of different phases (multi-phase clocks), a period detection circuit 6 for detecting the period of the input clocks, and a multi-phase clock multiplication circuit 5 fed with multi-phase clocks output from the frequency dividing circuit for generating the multi-phase clocks as multiplied clocks. The multi-phase clock multiplication circuit includes a plurality of timing difference dividing circuits 4a outputting signals corresponding to the divided timing difference between two inputs and a plurality of multiplication circuits 4b for multiplying and outputting outputs of two the timing difference dividing circuits. The plural timing difference dividing circuits includes a timing difference dividing circuit fed with the same phase clocks and a timing difference dividing circuit fed with outputs of two the timing difference dividing circuits.

In a preferred embodiment of the present invention, shown in FIG. 13, there are provided $2n$ timing difference dividing circuits for outputting signals obtained on dividing the timing difference of two input timings, the $2i$-1st timing difference dividing circuit 208, 210, 212, 214, where $1 \leq i \leq n$, is fed with an ith same clock as the two inputs, the 2ith timing difference dividing circuit (209, 211, 213, 215), where $1 \leq i \leq n$, is fed with the ith clock and (i+1 mod n)th clock, where mod denotes a remainder operation such that i+1 mod n means a remainder obtained on dividing I+1 with n, there being further provided $2n$ pulse width correction circuits 216 to 223 fed with an output of a Jth timing difference dividing circuit, where $1 \leq J \leq 2n$, and with an output of a timing difference dividing circuit, as input, where J+2 mod n means a remainder resulting from division of J+2 by n, and n multiplication circuits 224 to 227 fed with an output of a Kth pulse width correction circuit, where $1 \leq K \leq n$, and an output of the (K+n)th pulse width correction circuit, as inputs.

In a preferred embodiment of the present invention, shown in FIG. 15, the timing difference dividing circuit includes a logical circuit NOR14 fed as input with first and second input signals and which sets the internal node to the potential of a first power source when the first and second input signals are at a first value, and a buffer circuit or an inverter circuit INV15 for changing the output logical value depending on the relative magnitudes of the potential of the internal node as an output of the logical circuit and a threshold value, a plurality of series connected switch elements and capacitances are connected in parallel across the internal node and the second power source (MN51 and CAP51, MN52 and CAP52, and MN53 and CAP53). The capacitance to be added to the internal node being determined by period control signal coupled to a control terminal of the switch.

By providing a semiconductor integrated circuit with the clock control circuit according to the present invention, for supplying clocks to a clock synchronization circuit, phase-matched clocks can be supplied over the entire clock propagation path.

For explanation of the above-described embodiments of the present invention in more detail, certain preferred embodiments of the present invention will be hereinafter explained with reference to the drawings.

FIG. 1 shows a structure of a preferred embodiment of the present invention. In the preferred embodiment of the present invention, shown in FIG. 1, a circuit comprised of a clock propagation path, folded on itself to constitute a forward route and a return route in which the timing at a mid point of the forward and return routes is taken to adjust the delay induced in the clock path, includes a timing averaging circuit for averaging the timing difference between respective pulses of the clock signals.

On the forward route $11_1$ of the clock propagation path, the delay time from a point A to a reversing point $11_3$ is a, the delay time from a point B to the reversing point $11_3$ is b, the delay time from a point C to the reversing point $11_3$ is c, and the delay time from a point D to the reversing point $11_3$ is d. On the return route $11_2$ of the clock propagation path, a point E is at the delay time d from reversing point $11_3$, a point F is at the delay time c from reversing point $11_3$, a point G is at the delay time b from reversing point $11_3$, and a point H is at the delay time a from reversing point $11_3$.

The clocks input from an input buffer 12 to the forward route $11_1$ of the clock propagation path is turned back (direction-reversed) at the reversing point $11_3$ and propagate on the return route 112. Two clock signals at points A and H are input to a timing averaging circuit $10_1$, from which an output signal L, as an average of the two timing differences, is output. Similarly, two clock signals at points B and G are input to a timing averaging circuit $10_2$, from which an output signal L, as an average of the two timing differences, is output. Two clock signals at points G and F are input to a timing averaging circuit $10_3$, from which an output signal J, as an average of the two timing differences, is output. Similarly, two clock signals at points D and E are input to a timing averaging circuit $10_4$, from which an output signal I, as an average of the two timing differences, is output.

FIG. 2 shows a timing diagram for illustrating the basic operation of an embodiment of the present invention shown in FIG. 1. The clock propagation path is arranged in a turned-back fashion, as shown in FIG. 1. The respective points A, B, C and D of the forward route $11_1$ are adjacent to respective points H, G, F and E of the return route $11_2$. Clock outputs are input to timing averaging circuits $10_1$ to $10_4$ which then output four timing difference signals each having a median value between two clocks.

Since the median values of the timing signals 2a, 2b, 2c and 2d at the respective neighboring points A–H, B–G, C–F and D–E are equal to the timing at the reversing-back point $11_3$, the output timings of outputs I, J, K and L of the timing averaging circuits become equal one another.

That is, referring to FIG. 2, the timing of a falling edge of an output L of a timing averaging circuit $10_1$, outputting an average value of the timing difference 2a of the adjacent point set A–H is (preset delay time Cons)+(2a/2)=Cons+a, with respect to the rising edge of the clock at point A. The preset delay time cons is the propagation delay time proper to e.g., the timing averaging circuits $10_1$ to $10_4$. Specifically, the preset delay time cons is the propagation delay time from inputting a given signal to two inputs of the timing averaging circuit until outputting of the resulting output signal.

An output K of a timing averaging circuit $10_2$, fed with a clock from a neighboring point set B–G, rises after a delay time corresponding to a delay time (a–b) to the neighboring point B plus (preset delay time Cons)+(2b/2) and rises after Cons+a as from the clock rising edge time point at the point A. An output J of a timing averaging circuit $10_3$ and an output i of a timing averaging circuit $10_4$ rise after time Cons=a as from the time point of the clock falling edge at point A, with the timings of the rising edges of the signals I, J, K and L thus being coincident with one another.

FIGS. 3 and 4 illustrate the principle of the timing averaging circuit 10 according to an embodiment of the present invention. Meanwhile, the timing averaging circuit 10 is a timing difference dividing circuit (interpolator) for outputting a signal corresponding to the delay time obtained on interior division of a timing difference of two input signals by a preset ratio a, wherein the ratio of the interior division is set to 0.5 to make equal division of the timing difference. It is noted that the timing averaging circuit shown in FIG. 1 is constituted by the timing difference division circuit.

Figure 3A:
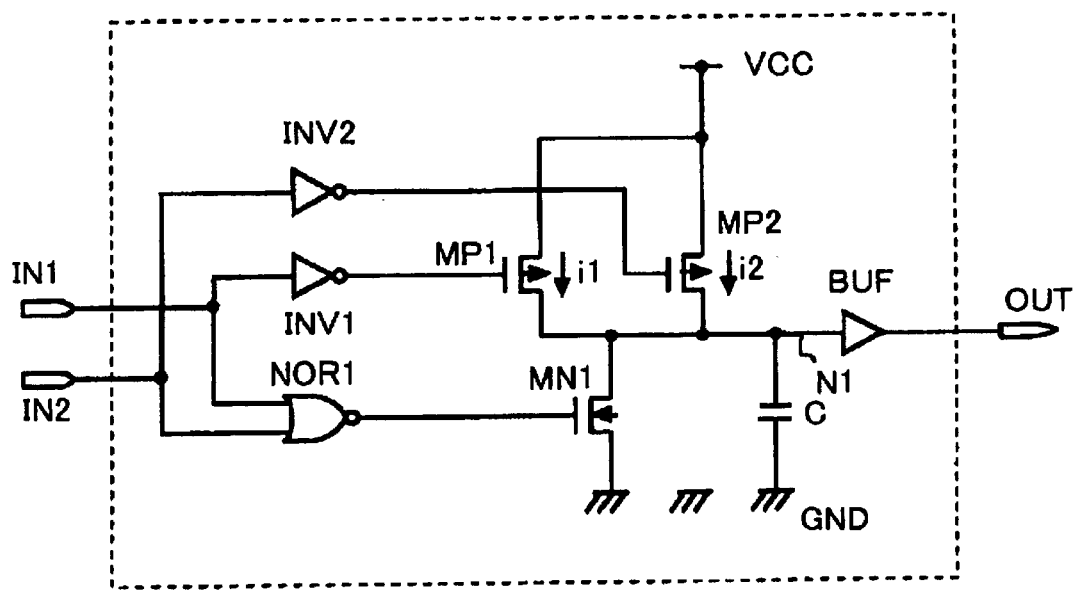
FIG. 3 shows the structure of a timing averaging circuit embodying the present invention.

Referring to FIG. 3a, the timing difference division circuit (TMD) includes inverters INV1, INV2, inverting and outputting input signals IN1, IN2, and p-channel MOS transistors MP1, MP2 having its source, gate and drain connected to a power source VCC, outputs of the inverters IN1, IN2 and to an internal node N1, respectively. The timing difference division circuit (TMD) also includes a buffer circuit BUF which has its internal node N1 connected to an input end and a logical output value of which is changed when the potential of the internal node N1 is higher or lower than a threshold voltage, and a NOR circuit NOR1 fed with input signals IN1, IN2 to output the results of NOR operations. The timing difference division circuit (TMD) also includes an N-channel MOS transistor MN1 having its drain, source and gate connected to the internal node N1, ground potential GND and to the output end of the NOR circuit NOR1, respectively and a capacitor C connected across the internal node N1 and the ground GND.

Figure 3B:
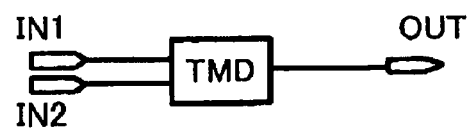

The timing difference division circuit (TMD) is shown in a block diagram of FIG. 3b. It is noted that the timing averaging circuit outputs a signal corresponding to the delay time obtained on averaging the timing difference of an input signal, with the ratio of the interior division of the timing averaging circuit being set to 0.5.

FIG. 4c shows three timing difference division circuits (TMDs), of which a first timing difference division circuit (TMD) has its two inputs fed with the same input signal IN1 to issue an output signal OUT1. A second timing difference division circuit (TMD) is fed with the input signals IN1, IN2 to issue an output signal OUT2, whilst a third timing difference division circuit (TMD) has its two inputs fed with the same input signals IN1, IN2 to issue an output signal OUT2. Of these three timing difference division circuits (TMDs), the second timing difference division circuit (TMD), fed with the input signals IN1, IN2 to output the output signal OUT2, has a structure shown in FIG. 3a. As for the circuit structure having the first to third timing difference division circuits (TMDs), shown in FIG. 4C, reference should be made to, for example, a structure shown in FIG. 13a.

Referring to FIG. 4d, there is a timing difference T between the input signals IN1, IN2, with the first, third and second timing difference division circuits (TMDs) issuing an output signal OUT1 with delay time t1, an output signal OUT3 with delay time t3 and an output signal OUT2 with delay time t2, respectively. The delay time t2 is obtained on interiorly dividing the delay time t1 and the delay time t3.

Referring again to FIG. 3a, when the input signals IN1, IN2 are low, an output of the NOR circuit NOR1 goes high, with the N-channel MOS transistor MN1 being fired, the node N1 being at a ground potential and with an output of the buffer circuit BUF going low.

If, with the threshold voltage V of an output of the buffer circuit BUF being inverted to the high level, the same input signals IN1 are fed to the two input terminals IN1, IN2, the outputs of the inverters IN1, IN2 are low, both the p-channel MOS transistors MP1, MP2 being fired, and the N-channel MOS transistor MN1 being turned off, with the node N1 being charged with drain currents i1, i2. If charges of the node N1, that needs to be charged up to a point of reaching the threshold value of the buffer circuit BUF is CV, where C and V denote the capacitance and the voltage, respectively, the delay time t1 is given by $$t1=CV/(i1+i2).$$

Referring to FIG. 3a, if the input signal IN1 and the input signal IN2, rising with the delay of time T from the input signal IN1, are fed to the two input terminals IN1, IN2, as shown in FIG. 4c, an output of the inverter INV1 goes low at the time of rising of the input signal IN1, so that only the p-channel MOS transistor MP1 is turned on, while the N-channel MOS transistor MN1 is turned off, with the node N1 being charged with the drain current i1 for a time duration T (charge at N1 being i1T). As the input signal IN2 then goes high, an output of the inverter INV2 goes low, with the p-channel MOS transistors MP1, MP2 being turned on, with the N-channel MOS transistor MN1 being turned off, so that the node N1 is charged with the drain currents i1+i2. If the charge of the node N1 that needs to be charged up to a threshold value of the buffer circuit BUF is CV, where C and V denote the capacitance and the voltage, respectively, the delay time t2 is given by:

$$t2 = T + (CV - i1T)/(i1 + i2)$$
$$= T + CV/(i1 + i2) - i1T/(i1 + i2)$$
$$= T(i2/(i1 + i2)) + t1.$$

If the drain currents i1, i2 of the p-channel MOS transistors MP1, MP2 are equal to each other, $$t2=(1/2)T+t1.$$

If, in FIG. 3a, the same input signals iN2, delayed by time T from the input signal IN1, is fed to the two input terminals IN1, In2, $$t3=T+CV/(i1+i2).$$

Thus, by charging the capacitance of the internal node N1 of the timing averaging circuit shown in FIG. 3a during the time T corresponding to the timing difference of the two input clocks, by the p-channel MOS transistor MP1 fed with the input signal IN1, and by charging the capacitance by the p-channel MOS transistor MP2 fed with the input signal IN2 and by the two p-channel MOS transistors, a time difference of T/2, as an average value of the timing difference T of the input signals IN1 and IN2, is produced from the time t1 as compared to a case where the same input signal IN1 is input from the outset for charging by the two p-channel MOS transistors MP1, MP2.

So, the timing difference division circuit is termed "a timing averaging circuit".

According to an aspect of the present invention, without using a PLL circuit and a DLL circuit, the delayed time difference in the clock path 11 can be suppressed low.

If, in the timing averaging circuit, the timing difference between the clock which undergoes transition first and the clock which undergoes transition later is to be divided by a factor of ½ to output a signal with an averaged timing difference, this is accomplished by equating the on-currents (drain currents) i1, i2 of the p-channel MOS transistors MP1, MP2 of FIG. 3a. It is noted that, by setting the ratio of the on-currents (drain currents) i1, i2 of the p-channel MOS transistors MP1, MP2 of FIG. 3a to, for example, m:1, where m>1, an output signal having a delay time corresponding to the division of the timing difference T of two clocks by an optional interior division ratio. According to the present invention, this sort of the timing difference division circuit may be used as a timing averaging circuit fed with two clocks at two points on the forward and return routes of the clock propagation path. By so doing, such a case in which the delay time between a first time on the forward route and the reversing point is not equal to the delay time between the reversing point and a second position on the return route can be coped with to realize phase matching of respective clocks output by the timing difference dividing circuit.

FIG. 5 shows a configuration of a second embodiment of the present invention. In this second embodiment, the clock path 11 is functionally "circular", with a direction-reversing point serving as a beginning point of the clock route (i.e., return route). An output of the input buffer 12 is fed to a branched point on a clock propagation path between a route A, B, C and D and a route E, F, G and H. Two clock signals at corresponding points (i.e., pairing points) A and H forming a neighboring point pair are input to the timing averaging circuit $10_1$ to output an output signal L corresponding to the average delay time of two timing differences. Two clock signals at corresponding points B and G are input to the timing averaging circuit $10_2$ to output an output signal K corresponding to the average delay time of two timing differences. Two clock signals at corresponding points C and F are input to the timing averaging circuit $10_3$ to output an output signal J corresponding to the average delay time of two timing differences. Similarly, two clock signals at points D and E are input to the timing averaging circuit $10_4$ to output an output signal I corresponding to the average delay time of two timing differences.

It should be noted that in the embodiment shown in FIG. 5, two branched routes intersect each other at the reversing point. However, these branched routes may extend in parallel (specifically, anti-parallel) each other without intersection, which configuration provides also the same advantage. The formulation shown in FIG. 5 has benefit of symmetrical arrangement of the clock path (routes) with respect to a symmetry line connecting the input point (branching point) and the intersecting point.S In the above-described embodiment (first embodiment) described with reference to FIG. 1, plural timing averaging circuits $10_1$ to $10_4$ are arranged along forward and return routes $11_1$, $11_2$ of the clock propagation path basically extending in a unidirectional direction. In the present second embodiment, there are provided forward and return routes $11_A$, $11_D$ of the clock propagation path, arranged at a distance from each other, and plural timing averaging circuits $10_1$ to $10_4$ arranged for extending along the rims of forward and return routes $11_A$ and $11_D$, for enlarging an area which allows for arraying of the timing averaging circuit within a chip.

In the second embodiment of the present invention, the timing averaging circuit 10 may be configured as shown for example in FIGS. 6 to 8. The timing averaging circuit 10, shown in FIGS. 6 to 8, averages the rising and falling timings of the clock signals. The timing averaging circuit, shown in FIG. 3a, is configured for outputting a rising signal prescribed by the delay time obtained on equally dividing the timing difference of the rising edges of the two clock signals. The timing averaging circuit shown in any of FIGS. 6 to 8 may be applied with advantage to a configuration of furnishing clocks to a circuit adapted for operating using both rising and falling edges.

The timing averaging circuit, shown in FIG. 6, is now explained.

Referring to FIG. 6, the timing averaging circuit includes a p-channel MOS transistor MP51, having its source connected to a source VCC, a p-channel MOS transistor MP2 having its source connected to a drain of the p-channel MOS transistor MP1, an n-channel MOS transistor MN51, having its drain connected to the drain of the p-channel MOS transistor MP2, and an n-channel MOS transistor MN52, having its drain connected to the source of the n-channel MOS transistor MN51 and its source connected to the ground potential, with the input IN1 being connected in common to the gates of the p-channel MOS transistor MP1, MP2 and the n-channel MOS transistors MN51, MN52.

The timing averaging circuit includes a p-channel MOS transistor MP53, having its source connected to a source VCC, a p-channel MOS transistor MP54 having its source connected to a drain of the p-channel MOS transistor MP53, an n-channel MOS transistor MN53, having its drain connected to the drain of the p-channel MOS transistor MP54, and an n-channel MOS transistor MN54, having its drain connected to the source of the n-channel MOS transistor MN53 and its source connected to the ground potential, with the input IN1 being connected in common to the gates of the p-channel MOS transistor MP53 and to the n-channel MOS transistor MN54 and with the input IN2 being connected in common to the gates of the p-channel MOS transistor MP54 and the n-channel MOS transistor MN53.

The timing averaging circuit also includes a p-channel MOS transistor MP55, having its source connected to the source VCC, a p-channel MOS transistor MP56 having its source connected to a drain of the p-channel MOS transistor MP55 and having its drain connected to the source VCC, a n-channel MOS transistor MN56, having its source connected to the drain of the n-channel MOS transistor MN56, having its source connected to the drain of the n-channel MOS transistor MN56 and having its drain connected to the ground, with the input IN2 being connected to the gates of the p-channel MOS transistor MP55 and the n-channel MOS transistor MN56.

The junction points of the p-channel MOS transistor MP52 and the n-channel MOS transistor MN51 is connected to an input end of the inverter INV5, while the junction points of the p-channel MOS transistor MP54 and the n-channel MOS transistor MN53 is connected to an input end of the inverter INV5, an output end of which is connected to an output terminal OUT.

The p-channel MOS transistors MP55, MP66 and the n-channel MOS transistors MN55, MN56 are connected to an input end of the inverter INV5, an output of which is connected to the output terminal OUT.

The operation of the timing averaging circuit shown in FIG. 6 is explained. When the input signal IN1 rises from the low level to the high level, static charges of the node M51 are discharged from the paths of the n-channel MOS transistors MN51, NM52. When the input signal IN2 rises after a time delay of T from the low level to the high level after a time delay of T, static charges of the node N51 are discharged from the n-channel MOS transistors of the two paths of the n-channel MOS transistors (n-channel MOS transistors MN51, NM52 and the n-channel MOS transistors MN53, NM54) so that a rising signal corresponding to the delay time obtained on averaging the timing difference T of the input signals IN1 and IN2 is output as an output signal, as described above.

When the input signal IN1 decays from the high level to the low level, the node 51 is charged from the path of the p-channel MOS transistors MP51, MP52 in the on state. When the input signal IN2 decays with a delay of time T, the node N51 is charged through the p-channel MOS transistors of the two paths (p-channel MOS transistors MN51, NM52 and the n-channel MOS transistors MN53, NM54) so that a decaying signal corresponding to the delay time equal to the averaged timing difference T between the input signals IN1, IN2 is output.

Since the input sequence of clocks IN1, IN2 is fixed in the timing averaging circuit shown in FIG. 6, it is necessary to connect a point at which a signal arrives first to a point at which a signal needs to be input first (IN1 of FIG. 6), in consideration of the arrangement of the clock path.

That is, if the timing averaging circuit shown in FIG. 6 is to be used for a timing averaging circuit $10_1$ of FIG. 5, a point A at which a signal arrives first is an input end IN1, and a point H at which the signal arrives with a time delay is connected to the input end IN2.

The reason is that, in the circuit configuration shown in FIG. 6, the number of transistors turned on and off by the inputs IN1, IN2 in the charging/discharging path is not symmetrical. For example, in two current paths across the source VCC and the internal node 52, (that is in the current paths of transistors MP51, MP52 and transistors MP53, MP54), the number of transistors turned on with the decaying of the input IN1 is three (MP51, MP52 and MP53, of which MP51 and MP3 operate as a constant current source), whereas the number of the transistors turned on with the decaying of the input IN2 is one (MP54), thus testifying to the non-symmetrical configuration with respect to the inputs IN1, IN2. In contrast with the timing averaging circuit of FIGS. 7 and 8, explained next, the circuit configuration shown in FIG. 6 is not provided with logical circuits for on/off control of a constant current source transistor, so that the number of transistors can be diminished correspondingly.

FIG. 7 shows the configuration of another embodiment of the timing averaging circuit according to the present invention. The timing averaging circuit, shown in FIG. 7, can be used even in a case wherein the clock inputting sequence is not determined at the outset. Moreover, inner transistors of NAND and NOR are used as parallel MOS transistors.

This timing averaging circuit, shown in FIG. 7, includes a NAND circuit NAND61, having the inputs IN1, IN2 as inputs, inverter circuits INV61, INV62 having the inputs IN1, IN2 as inputs, a p-channel MOS transistor MP61, having its source connected to the source VCC and also having its gate connected to an output end of the NAND circuits NAND61. The timing averaging circuit also includes an n-channel MOS transistor MN61, having its drain connected to the drain of the p-channel MOS transistor MP61 and having its gate connected to the output end of the inverter circuit INV61, and an n-channel MOS transistor MN62, having its drain connected to the source of the p-channel MOS transistor MP61 and having its source connected to the ground. The timing averaging circuit also includes an n-channel MOS transistor MN63 having its drain connected to the drain of the p-channel MOS transistor MP61 and having its gate connected to the output end of the inverter INV62, and an n-channel MOS transistor MN64 having its drain connected to the source of the n-channel MOS transistor MN63, and also having its source and the gate grounded and connected to the gate of the n-channel MOS transistor MN62, respectively.

The timing averaging circuit also includes a p-channel MOS transistors MP62, MP63, each having its source connected to the power source VCC and having its gate connected together, and p-channel MOS transistors MP64, MP65, each having its source connected to the drains of the p-channel MOS transistors MP62, MP63, and each having its gate connected to output ends of the inverter circuits INV64, INV63 fed with the inputs IN1, IN2, and an n-channel MOS transistor MN65 having its drain connected to the drains of the p-channel MOS transistors MP64, MP65 and having its gate connected to the output end of the NOR circuit NOR61 fed with the inputs IN1, IN2. The gates of the p-channel MOS transistors MP62, MP63 are connected in common to the gates of the n-channel MOS transistors MN62, MN64.

The drain of the p-channel MOS transistor MP61 is connected to the gate of the p-channel MOS transistor MP66, the source of which is connected to the power source, while the drain of the p-channel MOS transistor MP66 is connected to the drain of the n-channel MOS transistor MN66, with the gate of the n-channel MOS transistor MN66 being connected to the drain of the n-channel MOS transistor MN65, with the source of the n-channel MOS transistor MN66 being grounded.

The junction point of the p-channel MOS transistor MP66 and the n-channel MOS transistor MN66 is connected to the output terminal OUT through an inverter INV65, with an output of the inverter INV65 being connected through inverters INV66, INV67 to the common gate of the n-channel MOS transistors MN62, MN64 and to the common gates of the p-channel MOS transistors MP62, MP63.

The operation of the timing averaging circuit shown in FIG. 7 is explained.

In FIG. 7, when the input signals IN1, IN2 decay to the low level from the high level, an output terminal of the NAND circuit NAND 61 transits from the low level to the high level to turn the p-channel MOS transistor MP61 off, while turning on one and then both of the n-channel MOS transistors MN61, 63, the gates of which are fed with outputs of the inverters INV61, INV62. Since the output OUT is as yet at a high level, prior to decaying, the output potential OUT is transmitted through the inverters INV67, INV66 to the node N74, so that the node N74 goes high. Since the n-channel MOS transistors MN62, 64, the gate input of each of which is the node N74, are turned on, the node N71 is discharged, the potential of the node N71 is lowered to turn on the p-channel MOS transistor MP66. The potential of the node 73 goes high so that a decaying signal from the high level to the low level is output through the inverter INV65. The output signal OUT has a delay time corresponding to the delay time equal to one half of the timing difference between the input signals IN1, IN2. The output potential OUT of the inverter INV65 is transmitted through the inverters INV67, INV66 to the node N74. When the output potential OUT goes low, the n-channel MOS transistors MN62, 64 are turned off to turn on the p-channel MOS transistors MP62, MP63.

The timing averaging circuit shown in FIG. 7 includes the NAND circuit NAND 61, and logical circuits in the form of the inverters INV61, INV62, and outputs a signal of a delay time corresponding to the averaged timing difference between the input signals IN1, IN2, no matter which of the signals IN1, IN2 is advanced in phase relative to the other. (The averaged timing difference between the input signals IN1, IN2 is the average delay time between an output when an input is one of the input signals IN1 and IN2 which leads the other in phase and an output when an input is one of the input signals IN1 and IN2 which lags the other in phase.)

Referring to FIG. 7, when the input signals IN1, IN2 rise from the low level to the high level, an output of NOR circuit NOR61 decays from the high level to the low level to turn off the n-channel MOS transistor MN65 as well as to turn on one and then both of the p-channel MOS transistors MP64, MP65, the gates of which are fed with outputs of the inverters INV63, INV64. Since the output OUT is as yet at a low level, prior to rising, the output potential OUT is transmitted through the inverters INV66, INV67 to the node N74 to set the node N74 to a low level to turn on the n-channel MOS transistors MN62, MN63 having the node N74 as the gate input. This charges the node N72 to the low level to raise its potential to turn on the n-channel MOS transistor MN66. The node N73 goes low so that a rising signal from the low level to the high level is output through the inverter INV65. As aforesaid, the output signal OUT has a delay time corresponding to one-half the timing difference between the input signals IN1, IN2. The output potential OUT of the inverter INV65 is transmitted through the inverters INV66, INV67 to the node N74. When the output potential OUT goes high, the n-channel MOS transistors MN62, MN63 are turned on, while the p-channel MOS transistors MP62, MP63 are turned off.

The timing averaging circuit shown in FIG. 7 also includes a NOR circuit NOR61, and logical circuits in the form of the inverters INV63, INV64, and outputs a signal of a delay time corresponding to the averaged timing difference between the input signals IN1, IN2, no matter which of the signals IN1, IN2 is advanced in phase relative to the other. (The averaged timing difference between the input signals IN1, IN2 is the average delay time between an output when an input is one of the input signals IN1 and IN2 which leads the other in phase and an output when an input is one of the input signals IN1 and IN2 which lags the other in phase.) The timing averaging circuit shown in FIG. 7 acquires control signals (gate signals) for turning on/off the n-channel MOS transistors MN62, MN64 and p-channel MOS transistors MP62, MP63, operating as the constant current source for charging/discharging the internal nodes N71, N72, from the logical value of the output signal OUT. The present invention is, however, not limited to this feedback configuration, and may be appropriately modified, provided that, in discharging the internal node N71, based on the first and second input signals IN1, IN2, the n-channel MOS transistors MN62, MN64 operating as the constant current source are turned on, and that, in charging the internal node N72, the p-channel MOS transistors MP62, MP63 operating as the constant current source are turned on.

FIG. 8 shows an exemplary modification of the timing averaging circuit shown in FIG. 7. This timing averaging circuit, shown in FIG. 8, includes a NAND circuit NAND71, having the inputs IN1, IN2 as inputs, inverter circuits INV61, INV62 having the inputs IN1, IN2 as inputs, a p-channel MOS transistor MP71, having its source connected to the source VCC and also having its gate connected to an output end of the inverter INV72. The timing averaging circuit also includes an n-channel MOS transistor MN73, having its drain connected to the drain of the p-channel MOS transistor MP71 and having its gate connected to the output end of the inverter circuit INV72, and an n-channel MOS transistor MN74, having its drain connected to the source of the p-channel MOS transistor MP73 and having its source and gate connected to the ground and to the gate of the n-channel MOS transistor MN72.

The timing averaging circuit also includes a p-channel MOS transistors MP72, MP73, each having its source connected to the power source VCC and having its gates connected together, and p-channel MOS transistors MP74, MP75, each having its source connected to the drains of the p-channel MOS transistors MP72, MP73, and each having its gate connected to output ends of the inverter circuits INV74, INV73 fed with the inputs IN1, IN2, and an n-channel MOS transistor MN75 having its drain connected to the drains of the p-channel MOS transistors MP74, MP75 and having its gate connected to the output end of the NOR circuit NOR71 fed with the inputs IN1, IN2. The gates of the p-channel MOS transistors MP74, MP75 are connected in common to the gates of the n-channel MOS transistors MN72, MN73.

The drain of the p-channel MOS transistor MP71 is connected to the gate of the p-channel MOS transistor MP76, the source of which is connected to the power source, while the drain of the p-channel MOS transistor MP76 is connected to the drain of the n-channel MOS transistor MN76, with the gate of the n-channel MOS transistor MN66 being connected to the drain of the n-channel MOS transistor MN65, with the source of the n-channel MOS transistor MN66 being grounded.

The junction point of the p-channel MOS transistor MP76 and the n-channel MOS transistor MN76 is connected to the output terminal OUT through an inverter INV75.

The operation of the timing averaging circuit shown in FIG. 8 is explained.

In FIG. 8, when the input signals IN1, IN2 decay to the low level from the high level, an output terminal of the NAND circuit NAND 71 transfers from the low level to the high level to turn the p-channel MOS transistor MP71 off, while turning on one and then both of the n-channel MOS transistors MN71, 73, the gates of which are fed with outputs of the inverters INV71, INV72. The node N81 is discharged, the potential of the node N81 is lowered to turn on the p-channel MOS transistor MP76. The potential of the node 83 goes high so that a rising signal from the low level to the high level is output through the inverter INV75. The output signal OUT has a delay time corresponding to the delay time equal to one half the timing difference between the input signals IN1, IN2.

Referring to FIG. 8, when the input signals IN1, IN2 rise from the low level to the high level, an output of NOR circuit NOR71 decays from the high level to the low level to turn off the n-channel MOS transistor MN65 as well as to turn on one and then both of the p-channel MOS transistors MP74, MP75, the gates of which are fed with outputs of the inverters INV63, INV64. The node N82 is charged to the high level to raise its potential to turn on the n-channel MOS transistor MN76. The node N83 goes low so that a decaying signal from the high level to the low level is output through the inverter INV75. As aforesaid, the output signal OUT has a delay time corresponding to one-half the timing difference between the input signals IN1, IN2.

Referring to FIGS. 9 to 13, a third embodiment of the present invention is explained. This embodiment renders it possible to apply the present invention to a configuration in which the delay on the clock propagation path is longer than the clock period tCK. Recently, with the tendency towards more variegated functions of the semiconductor integrated circuit, the length of the clock propagation path tends to be increased, while the operating frequency is becoming higher. Thus, if, in the configuration of the above-described embodiment shown for example in FIG. 1, the delay quantity on the clock propagation path is longer than the clock period tCK, for example, if the delay time $2a$ between a point A on the forward route $11_1$ remotest from the reversing point $11_3$ on the clock propagation path and a point H on the return route $11_2$ is longer than the clock period tCK, the following results. That is, in the timing averaging circuit $10_1$, to the fist and second inputs which are input clocks from the points A and H, there is input, before a clock input to the clock propagation path reaches the point H to be input to the second input end, the clock of the next following clock cycle is input to the point A, such that a desired average value cannot be output. The present third embodiment of the present invention renders it possible to realize the desired operation when the delay on the clock propagation path is longer than the clock period tCK.

Referring to FIG. 9, clocks from frequency division by a frequency dividing circuit 14 from the input buffer 12 are fed to the clock propagation path (forward route $11_1$, reversing point $11_3$ and return route $11_2$).

The clock signals from the input buffer 12 with a clock period tCK, are frequency-divided by a frequency dividing circuit 14. The clocks input to the clock propagation path 11 are turned on the clock propagation path, with two clock signals at points A and H being fed to the timing averaging circuit $10_1$. An output signal L with the delay time corresponding to a mean value of two timing differences is input to a multiplication circuit $15_1$ which then outputs a multiplied signal P. Two clock signals at points B and G are fed to the timing averaging circuit $10_2$ which then outputs an output signal K with a delay time corresponding to a mean value of the two timing differences to a multiplication circuit $15_2$ to output a signal O. Two clock signals at points C and F are fed to a timing averaging circuit $10_3$ which then outputs an output signal J with a delay time corresponding to a mean value of the two timing differences to a multiplication circuit $15_3$ to output a multiplied signal N. Two clock signals at points D and E are fed to a timing averaging circuit $10_4$ which then outputs an output signal I with a delay time corresponding to a mean value of the two timing differences to a multiplication circuit $15_1$ to output a signal M.

Figure 10:
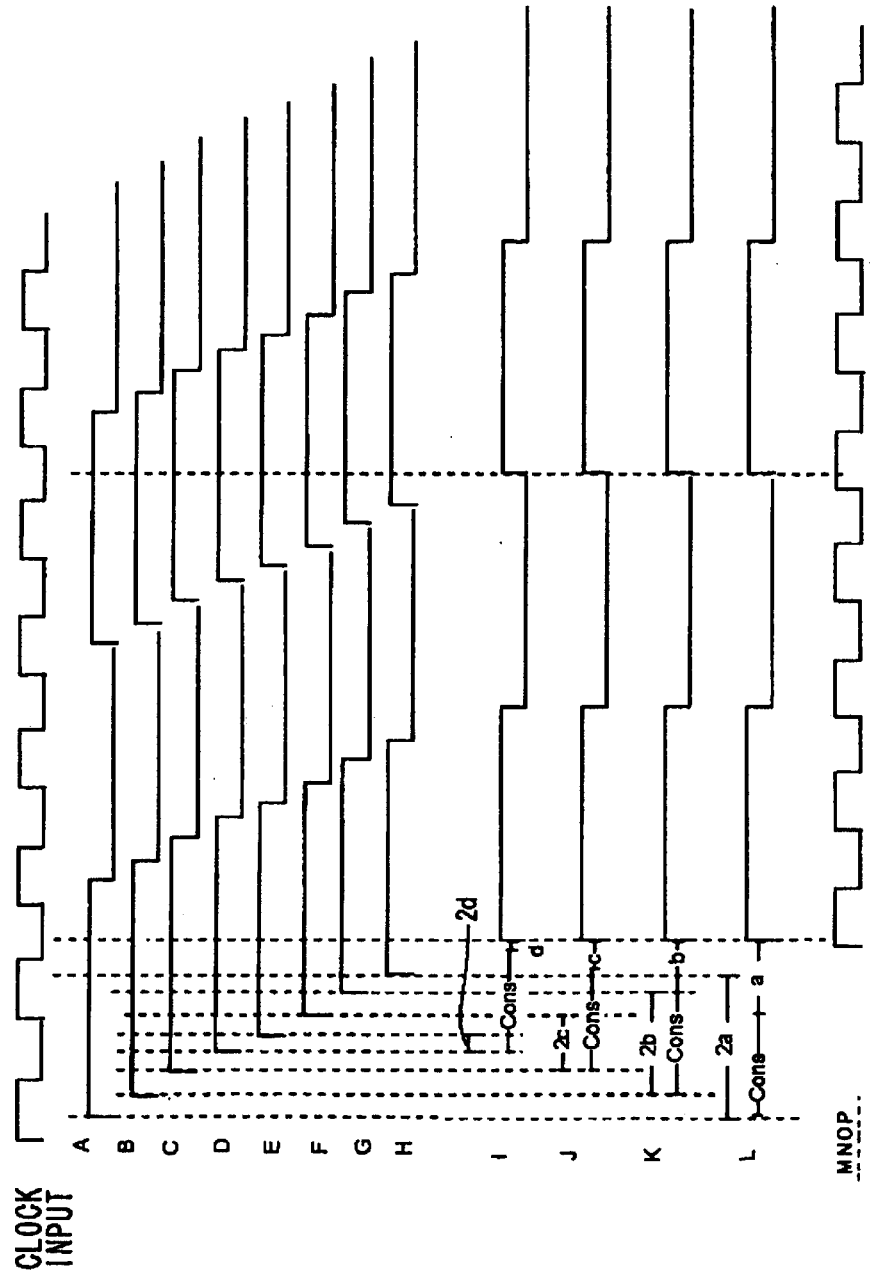
FIG. 10 is a timing chart for illustrating the operation of the third embodiment of the present invention.

FIG. 10 shows a timing chart of the circuit shown in FIG. 9. The clocks are frequency-divided by the frequency dividing circuit 14 and the frequency divided clocks are sent to the clock propagation path 11 on which the clocks are turned and sent over a bidirectional clock transmission line. A mean value of the timings of the clock pulses is taken by the timing averaging circuit 10, an output of which is multiplied by the multiplication circuit 15 to output a multiplied output.

According to the present invention, the multiplication circuit is realized by the combination of timing averaging circuits. This multiplication circuit may be such a configuration proposed by the present inventors in JP Patent Applications JP-H-09-157042 (now JP-A-11-004146) and JP-H-09-157028 (now JP-A-11-004145).

In the present embodiment, the delay magnitudes of the clock propagation path can be matched solely by the timing averaging circuit, without using a feedback circuit, if the delay magnitude on the clock propagation path 11 is longer than the clock period tCK.

Referring to FIGS. 11 to 15, an exemplary configuration of the multiplication circuit 15 embodying the present invention is explained. Referring to FIG. 11, in this multiplication circuit is the clock once frequency divided to give multi-phase clocks, and the timings among two consecutive phases of the multi-phase clocks are averaged to produce a new clock by way of timing averaging. Thus, the clock multiplication circuit uses this new clock output and a clock of a non-averaged output to double the number of phases, followed by synthesizing these clocks to perform clock multiplication.

In more detail, referring to FIG. 11, the multiplication circuit 15 includes a frequency dividing circuit 2 for frequency dividing clocks 1 (in an preferred embodiment of the present invention, an output of the timing difference averaging circuit) to generate multi-phase clocks 3, a multi-phase clock multiplication circuit 5, fed with outputs 3 of the frequency dividing circuit 2, a period detection circuit 6 made up of a fixed number of stages of ring oscillators and a counter for counting the number of oscillations of the ring oscillator during one clock period to detect the clock period and a clock synthesis circuit 8 for synthesizing outputs the multi-phase clock multiplication circuit 5 to generate multiplied clocks 9. The multi-phase clock multiplication circuit 5 includes plural timing difference dividing circuits 4a for outputting a signal corresponding to the interior division of timing differences of two input signals and plural multiplication circuits 4b for multiplying outputs of two timing difference dividing circuits.

The plural timing difference dividing circuits 4a comprise timing difference dividing circuits each fed with the same phase clocks and with a timing difference dividing circuits each fed with two neighboring clocks. The period detection circuit 6 outputs a control signal 7 to adjust the load capacity of the timing difference dividing circuits 4a in the multiphase clock multiplication circuit 5 to control the clock period.

Figure 12:
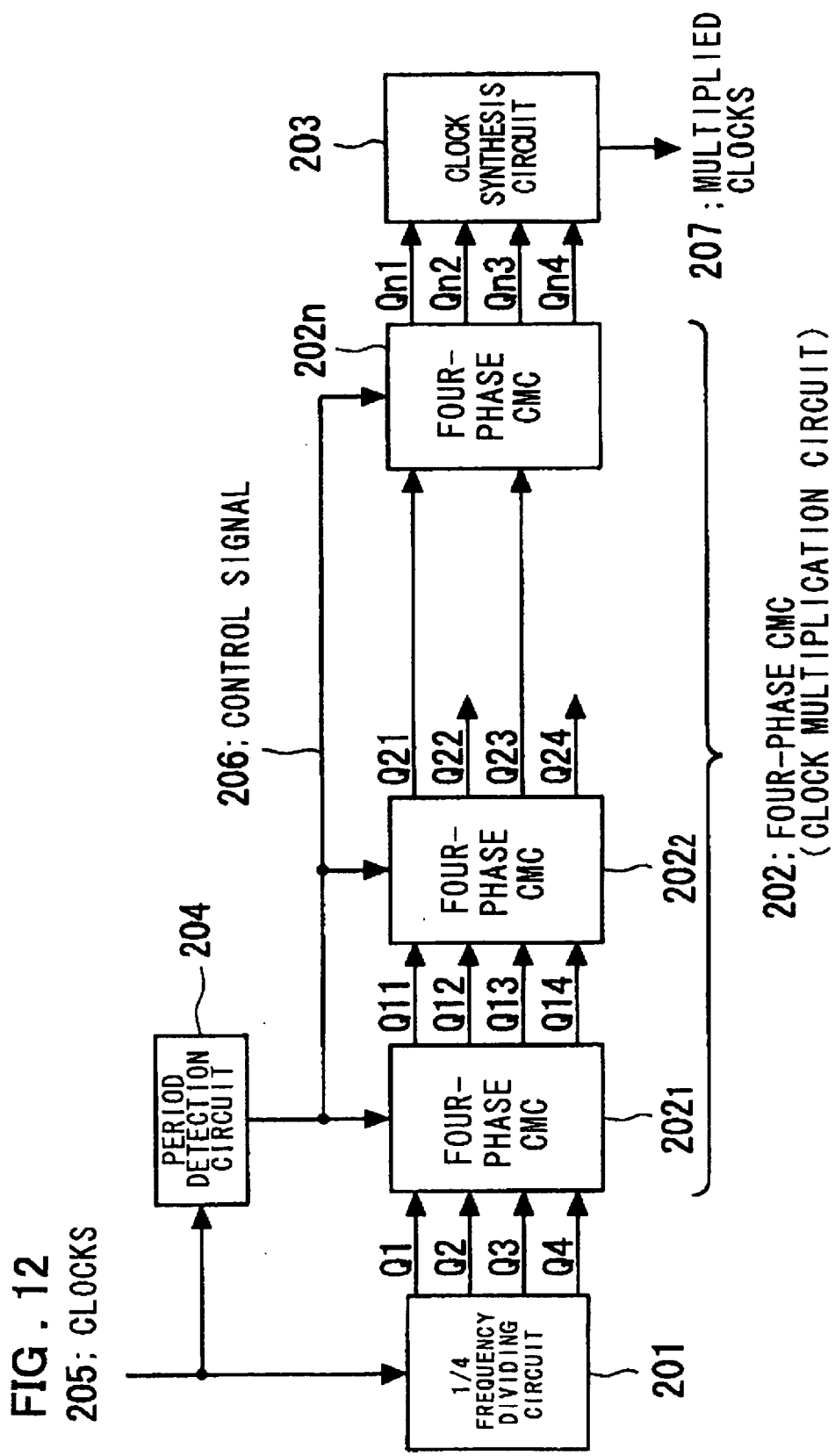
FIG. 12 shows an exemplary structure of a multi-phase clock multiplication circuit shown in FIG. 11.

FIG. 12 shows a specified configuration of a multiplication circuit for generating four-phase clocks as illustration of the multiplication circuit 15. Referring to FIG. 12, the multiplication circuit includes a ¼ frequency dividing circuit 201 for dividing the frequency of the input clocks 204 by four for outputting four-phase clocks Q1 to Q4, n series-connected four-phase clock multiplication circuits $202_1$ to $202_n$, a clock synthesis circuit 203 and a period detection circuit 204. The final-stage four-phase clock multiplication circuit $202_n$ outputs 2n-multiplied four-phase clocks Qn1 to Qn4 which are synthesized by the clock synthesis circuit 203 to output frequency multiplied clocks 207. Meanwhile, the number of stages of the four-phase clock multiplication circuits is arbitrary.

A ¼ frequency dividing circuit 201 divides input clocks 205 by ¼ to generate four-phase clocks Q1, Q2, Q3 and Q4, which then are multiplied by the four-phase clock multiplication circuit $202_1$ to generate four-phase clocks Q11 to Q14. Similarly, 2n-multiplied four-phase clocks Qn1 to Qn4 are produced from the four-phase clock multiplication circuit $202_n$.

The period detection circuit 204 is made up of a fixed number of stages of ring oscillators, and a counter. During one period of the clocks, the period detection circuit 204 counts the number of oscillations of the ring oscillators to output a control signal 206 according to the number of counts to adjust the load in the four-phase clock multiplication circuit 202. This period detection circuit 204 eliminates variations in the operating range of clock periods and device characteristics.

The four-phase clocks are rendered into eight phase clocks by the four-phase clock multiplication circuit 202 and again rendered back into four phase clocks for continuous frequency multiplication.

FIG. 13 shows an illustrative structure of the four-phase clock multiplication circuit $202_n$. It is noted that the four-phase clock multiplication circuits $202_1$ to $202_n$ shown in FIG. 12 are all of the same structure.

Figure 13A:
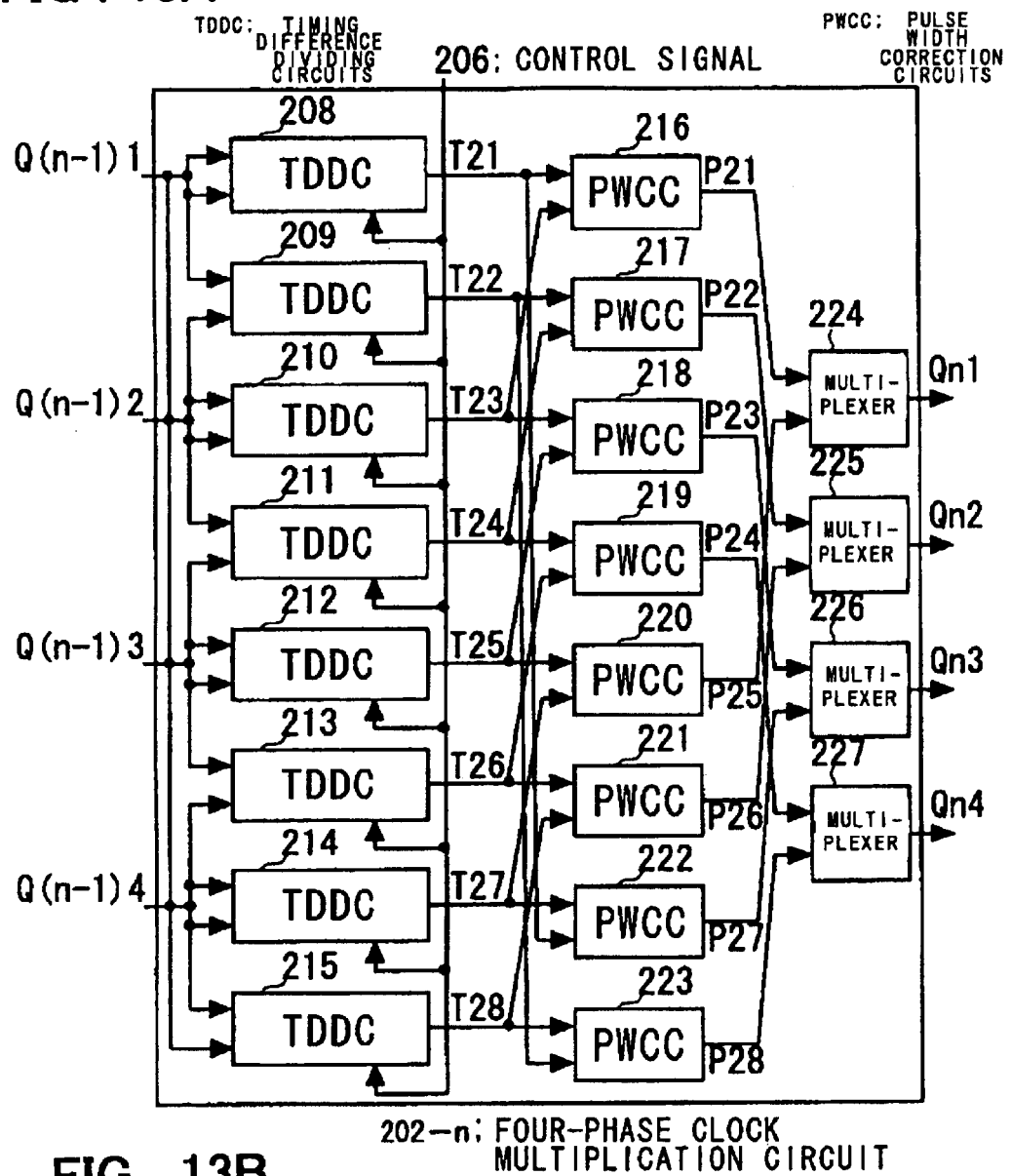
FIG. 13 shows an illustrative structure of the multi-phase clock multiplication circuit.
Figure 13B:
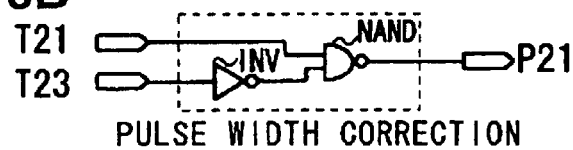

Referring to FIG. 13a, this four-phase clock multiplication circuit $202_n$ is made up of eight timing difference dividing circuits 208 to 215, eight pulse width correction circuits 216 to 23 and four multiplication circuits 224 to 227. FIG. 13b shows the structure of a pulse width correction circuit comprised of a NAND circuit fed with a signal comprised of a second input T23 inverted by the inverter IN2 and with the first input T21 as inputs.

Figure 13C:
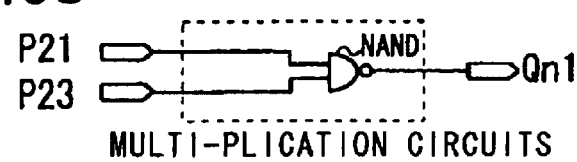

FIG. 13c shows a structure of a multiplexing circuit comprised of a 2-input NAND circuit.

Figure 14:
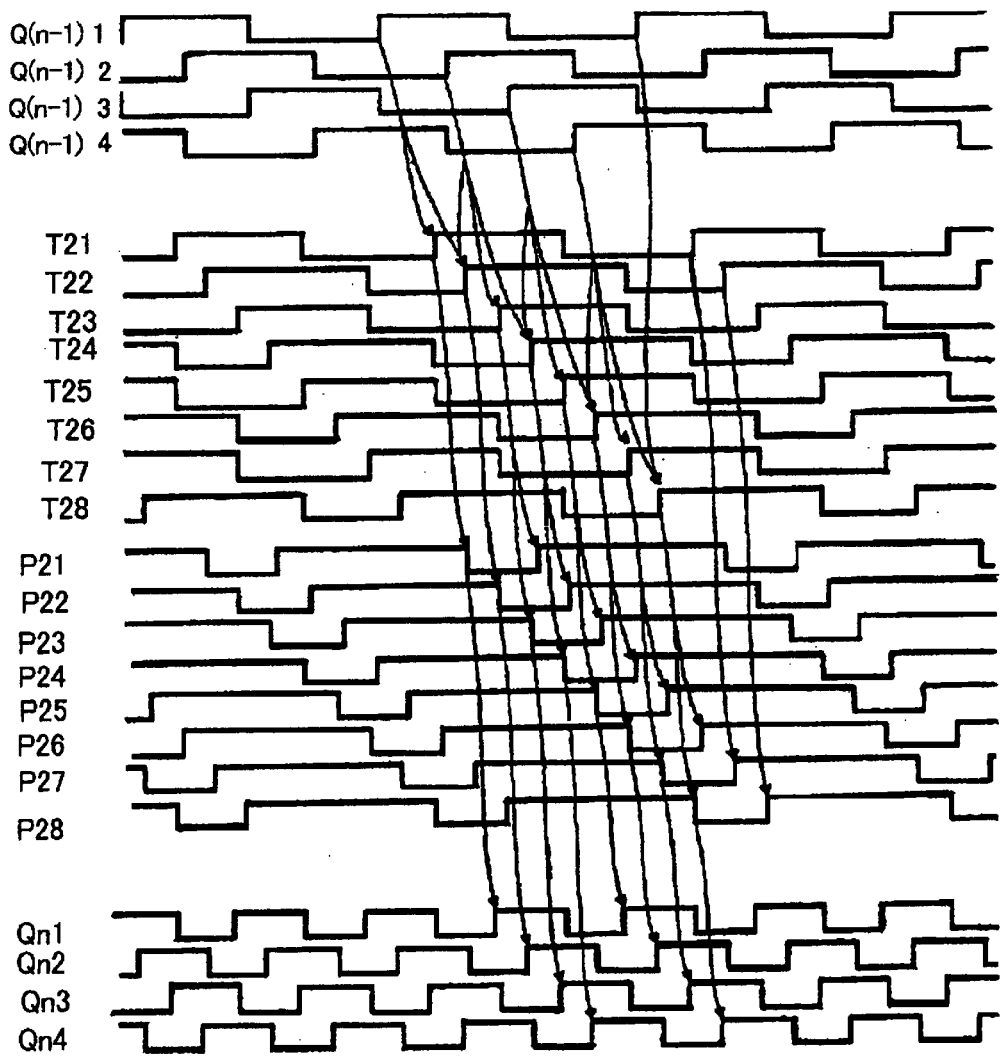
FIG. 14 is a timing chart for illustrating the operation of the multi-phase clock multiplication circuit.

FIG. 14 shows a signal waveform diagram for illustrating the timing operation of the four-phase clock multiplication circuits 202. The rising of the clock T21 is determined by the delay corresponding to the internal delay of the timing difference dividing circuit 208, the rising of the clock t22 is determined by the timing division by the timing difference dividing circuit 209 of the rising timing of the clock Q(n−1) 1 and the rising of the clock Q(n−1) 2 and the delay caused by the internal delay, and the rising of the clock T23 is determined by the timing division by the timing difference dividing circuit 209 of the rising timing of the clock Q(n−1)

1 and the rising of the clock Q(n−1) 2 and the delay caused by the internal delay. In similar manner, the rising of the clock t26 is determined by the timing division by the timing difference dividing circuit 213 of the rising timing of the clock Q(n−1) 3 and the rising of the clock Q(n−1) 4 and the delay caused by the internal delay, and the rising of the clock T27 is determined by the timing division by the timing difference dividing circuit 214 of the rising timing of the clock Q(n−1) 4 and the rising of the clock Q(n−1) 1 and the delay caused by the internal delay.

The clocks T21 and t23 are fed to the pulse width correction circuit 216 which then outputs a pulse P21 having a falling edge determined by the clocks T21 and a falling edge determined by the clock T23. By a similar sequence of operations, pulses P22 to P28 are generated, with the clocks P21 to P28 becoming 25% duty eight-phase pulses with dephasing of 45 degrees. The clock P25 dephased by 180 degrees from the clock P21 undergoes demultiplication in a multiplication circuit 224 so as to be output as 25% duty clocks Qn1. In similar manner, clocks Qn2 to Qn4 are generated. The clocks Qn1 to Qn4 become 50% duty four-phase pulses, dephased 90 degrees each. The periods of the clocks Qn1 to Qn4 are multiplied in frequency by two as clocks Qn1 to Qn4 are generated from the clocks Q(n−1) 1 to Q(n01) 4.

Figure 15A:
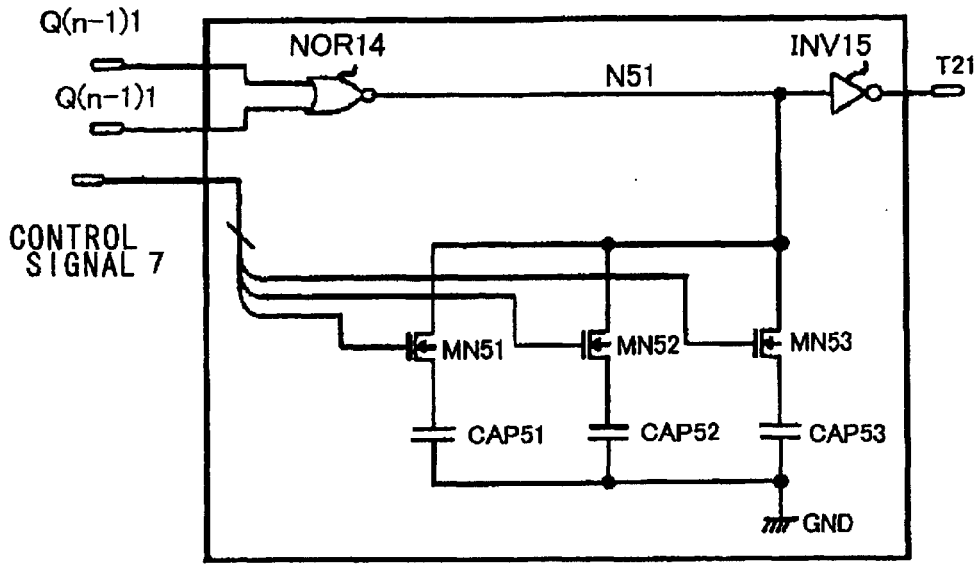
FIG. 15 shows an illustrative structure of timing difference dividing circuits 208, 209 of a four-phase clock multiplication circuit of FIG. 13.
Figure 15B:
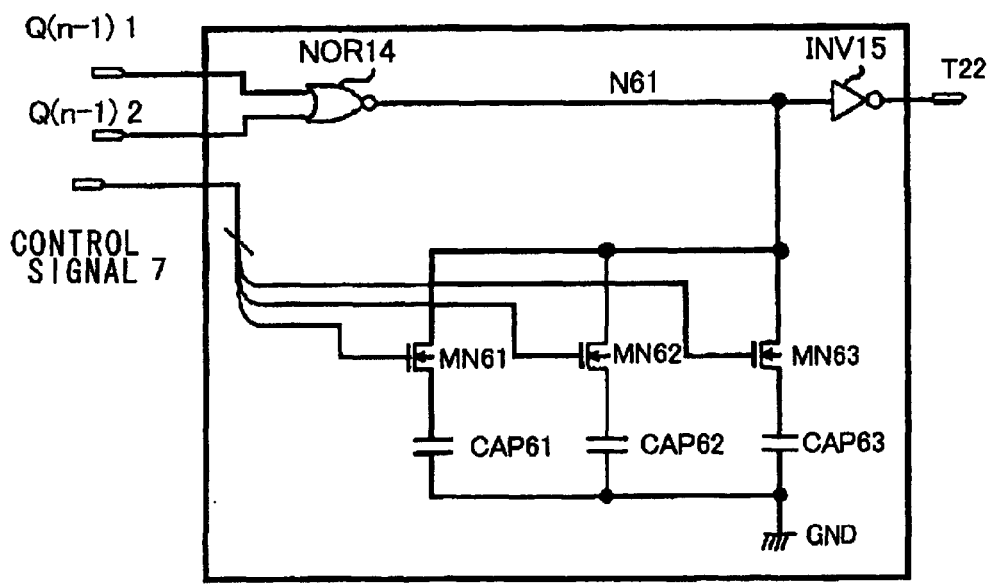

FIGS. 15a and 15b show the show illustrative structures of timing difference dividing circuits 208, 209 shown in FIG. 13. These circuits are at the same configuration and differ as to whether two inputs are the same signals or two neighboring signals are input. That is, the timing difference dividing circuit 208 and the timing difference dividing circuit 209 are at the same configuration except that, in the former, the same input Q(n−1) 1 is fed to a two-input NOR circuit NOR14, whereas, in the later, input Q(n−1) 1 and Q(n−1) 2 are fed to the two-input NOR circuit NOR14. The two-input NOR circuit NOR14 is made up of two p-channel MOS transistors connected in series across the power source VCC and the output end and the gates of which are fed with the input signals IN1, IN2 and two n-channel MOS transistors connected in parallel across the input end and the ground and the gates of which are fed with the input signals IN1, IN2.

An internal node N51 (N61) as an output node of the two-input NOR circuit NOR14 is connected to an input end of the inverter IN2 15. Across the internal node and the ground, there is connected a parallel circuit of a circuit comprised of a series connection of a n-channel MOS transistor MN51 and a capacitance CAP51, a series connection of a n-channel MOS transistor MN52 and a capacitance CAP52 and a series connection of a n-channel MOS transistor MN53 and a capacitance CAP53. To the gates of the respective n-channel MOS transistors MN51 to 53 is coupled the control signal 7 from the period detection circuit 6 to turn the transistors on or off. The size ratio of the gate widths of the n-channel MOS transistors MN51 to 53 to the capacitances CAP51 to 53 is set to, for example, 1:2:4. The load connected to the common node is adjusted in eight stages to set the clock period.

Turning to the timing difference dividing circuit 208, static charges of the node N51 are extracted through a n-channel MOS transistor of the NOR14. When the potential of the node N51 reaches the threshold value of the inverter IN2 15, there rise clocks T21, as output of the inverter INV15. If the static charges of the node N51 that need to be extracted when the threshold value of the inverter INV15 is reached, are denoted CV, where C and V denote the capacitance and the voltage, respectively, and the discharging current by the n-channel MOS transistor of the NOR14 is denoted I, the static charges of CV are discharged with the current value 2I, as a result of which the time CV/2I represents the timing difference (propagation delay time) as from the rising edge of the clock Q(n−1) 1 until the rising of the clock T21. When the clock Q(n−1) 1 is low, an output node N51 of the two-input NOR circuit NOR14 is charged to the high level, with the output clock T21 of the inverter INV15 being then at a low level.

As for the timing difference dividing circuit 209, static charges of the node N61 are extracted by the NOR14 after time tCKn (tCKn=multi-phase clock period) from the rising edge of the clock Q(n−1). The edge of the clock T22 rises when, after time tCKn, the potential of the node n61 reaches the threshold value of the inverter INV15 from the rising edge of the clock Q(n−1). If the static charges of the node N61 are denoted CV, and the discharge current of the n-MOS transistor of the two-input NOR circuit NOR14 is I, static charges CV are discharged from the rising of the clock Q(n−1) 1 with the current I during the time period tCKn, and extraction is made with the current 2I during the remaining period. So, the time $$tCKn+(CV-tCKn\ I)/2I=CV/2I+tCKn/2$$

represents the timing difference of the rising edge of the clock T22 from the rising edge of the clock Q(n−1) 1.

That is, the rising timing difference between clocks T22 and T21 is tCKn/2.

If the clock Q(n−1) 1 and the clock Q(n−1) 2 are both low and the output node N61 of the two-input NOR circuit NOR14 is charged through a pMOS transistor of the NOR14 from the power source to a high level, the clock T22 rises. The same situation holds for the clocks T22 to T28, with the timing difference between the rising edges of the clocks T21 to T28 being tCKn/2.

The pulse width correction circuits 216 to 223 generate 25% duty 8-phase pulses A23 to T28, dephased 45 degrees relative to one another.

The multiplexing circuits 224 to 227 generate 50% duty 4-phase pulses Qn1 to Qn4, dephased 45° relative to one another.

Figure 17:
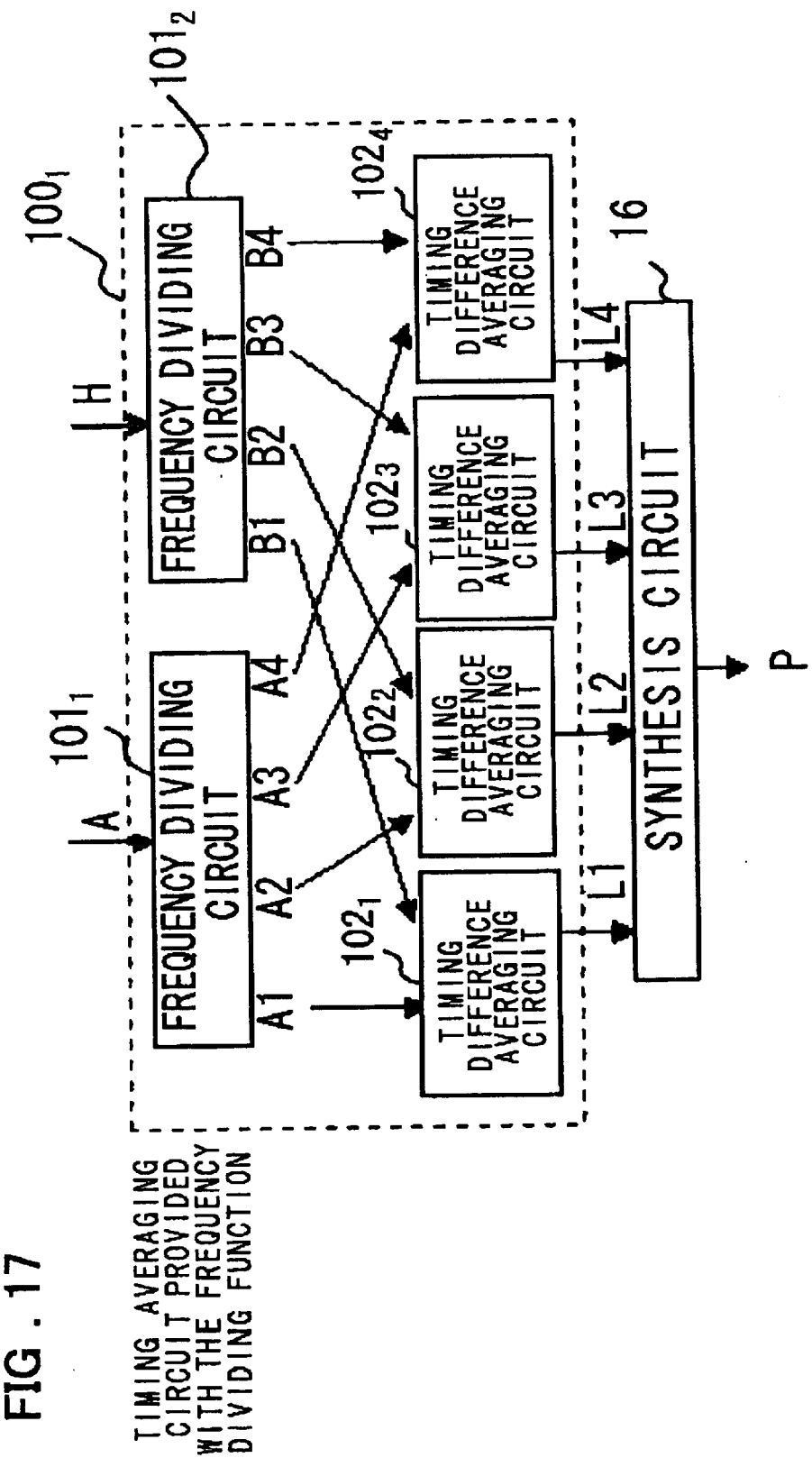
FIG. 17 shows a structure of a timing averaging circuit provided with a frequency dividing function.
Figure 18:
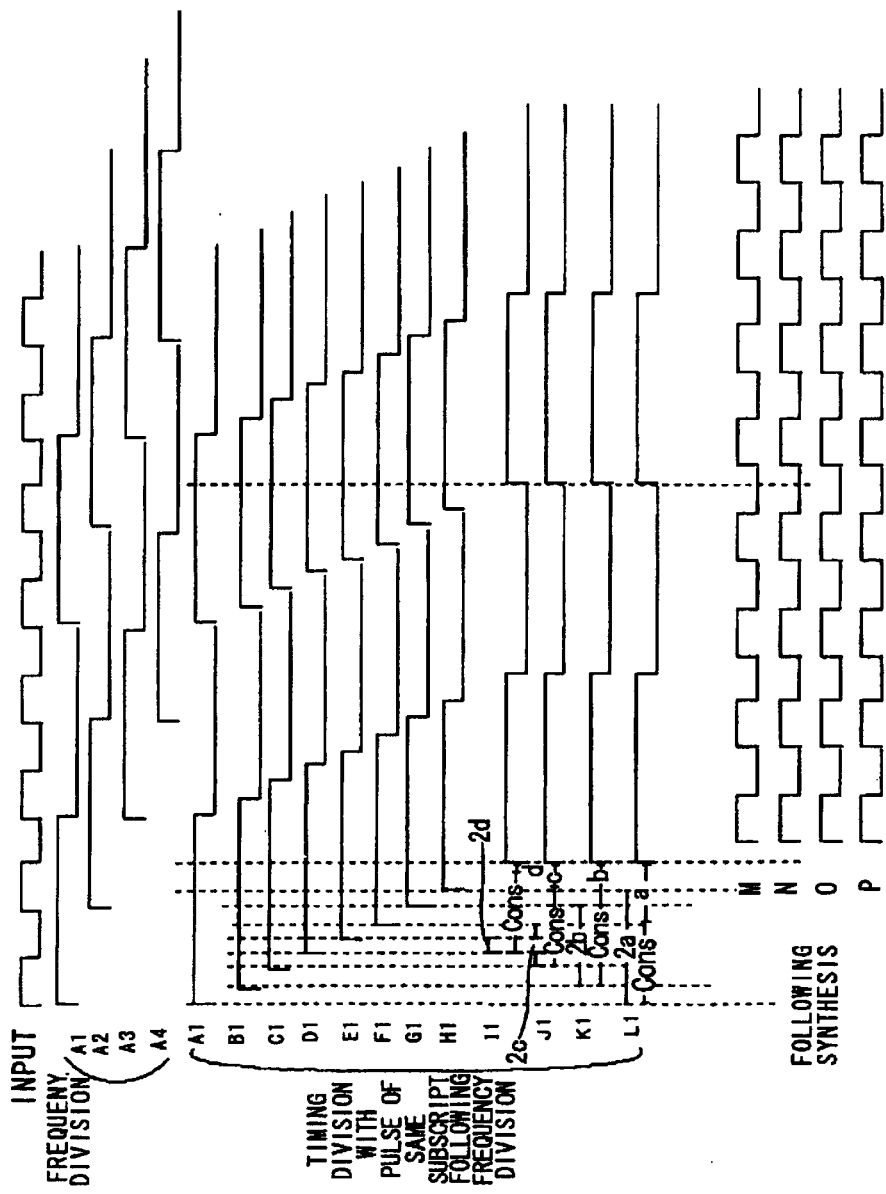
FIG. 18 is a timing chart for illustrating the operation of the fourth embodiment of the present invention.

Referring to FIGS. 16 to 18, a fourth embodiment of the present invention is now explained. In the present embodiment, the present invention is applied to a configuration in which the delay magnitude on the clock path is longer than the clock period tCK.

Referring to FIG. 16, showing the fourth embodiment of the present invention, clocks are first supplied to a direction-reversed bi-directional clock propagation path. In each neighboring point pair in the forward route $11_1$ and return route $11_1$ are frequency divided in timing averaging circuits $100_1$ to $100_4$ provided with the frequency dividing function. The clock pulse timings of the frequency divided clocks are averaged using the timing averaging circuits and subsequently synthesized by synthesis circuits $16_1$ to $16_4$. The clocks input to the clock propagation path 11 are direction-reversed on the clock propagation path, such that two clock signals at points A and H are fed to the timing averaging circuit $100_1$ provided with the frequency dividing function to generate output signals L1 to L4 with the delay time corresponding to the mean value of two timing differences of the frequency divided clocks, with the output signals L1 to L4 being synthesized by the synthesis circuit $16_1$ to output a signal P. Similarly, two clock signals at points B and G are fed to the timing averaging circuit $100_2$ provided with the frequency dividing function to generate output signals L1 to L4 with the delay time corresponding to the mean value of two timing differences of the frequency divided clocks, with the output signals K1 to K4 being synthesized by the synthesis circuit $16_2$ to output a signal O, and two clock signals at points C and F are fed to the timing averaging circuit $100_3$ provided with the frequency dividing function to generate output signals J1 to J4 with the delay time corresponding to the mean value of two timing differences of the frequency divided clocks, with the output signals J1 to J4 being synthesized by the synthesis circuit $16_3$ to output a signal N, while two clock signals at points D and E are fed to the timing averaging circuit $100_4$ provided with the frequency dividing function to generate output signals I1 to I4 with the delay time corresponding to the mean value of two timing differences of the frequency divided clocks, with the output signals I1 to I4 being synthesized by the synthesis circuit $16_4$ to output a signal M.

FIG. 17 shows the configuration of the timing averaging circuit $100_1$ provided with the frequency dividing function. The remaining timing averaging circuits $100_2$ to $100_4$ provided with the frequency dividing function are configured in a similar fashion. The signals A1 to A4, obtained on frequency division of the clock at point A on the clock propagation path 11 by a frequency dividing circuit $101_1$ are sent to timing averaging circuit $102_1$, to $102_4$, while the signals B1 to B4, obtained on frequency division of the clock at point H on the clock propagation path 11 by a frequency dividing circuit $101_2$ are sent to the timing averaging circuit $102_1$, to $102_4$. The timing averaging circuit $102_1$, outputs a median (mean) value signal L1 of the timing differences of A1 and B1, while the timing averaging circuit $102_2$ outputs a median value signal L2 of the timing differences of A2 and B2. In similar manner, the timing averaging circuit $102_4$ outputs a median value of the timing differences of A4 and B4, whilst the synthesis circuits 16 synthesizes signals I1 to I4 to output a signal P.

Thus, in the present embodiment, the clocks of each point of the forward route $11_1$ and the return route $11_1$ of the clock propagation path are frequency divided by four in the frequency dividing circuits $101_1$. 101, to generate four-phase clocks to generate four signals obtained on averaging the timing differences of the two corresponding frequency divided clocks in the timing averaging circuit, these four signals being synthesized to one signal P by the synthesis circuit 16. Since the output of the synthesis circuit 16 is equivalent to the multiplexed output, the delay magnitude of the clock path can be matched solely by the timing averaging circuits $100_1$ to $100_4$ provided with the frequency dividing function, without using the multiplexing circuit, even if the delay magnitude on the clock propagation path of the frequency divided clocks is longer than the clock period. The circuit scale of the present embodiment not provided with the multiplexing circuit is at a smaller circuit scale than the one of the third embodiment.

FIG. 18 shows a timing chart illustrating the operation of a fourth embodiment of the present invention.

The frequency dividing circuits $101_1$, $101_2$ fed with signals at points A and H output signals A1 to A4 and B1 to B4 obtained on frequency division by four, with the timing averaging circuit $102_1$ outputting a signal corresponding to a mean value of the timing differences of the signals A1 and B1, with the timing of the post-synthesized output signals M to P being corresponding with one another.

Figure 20:
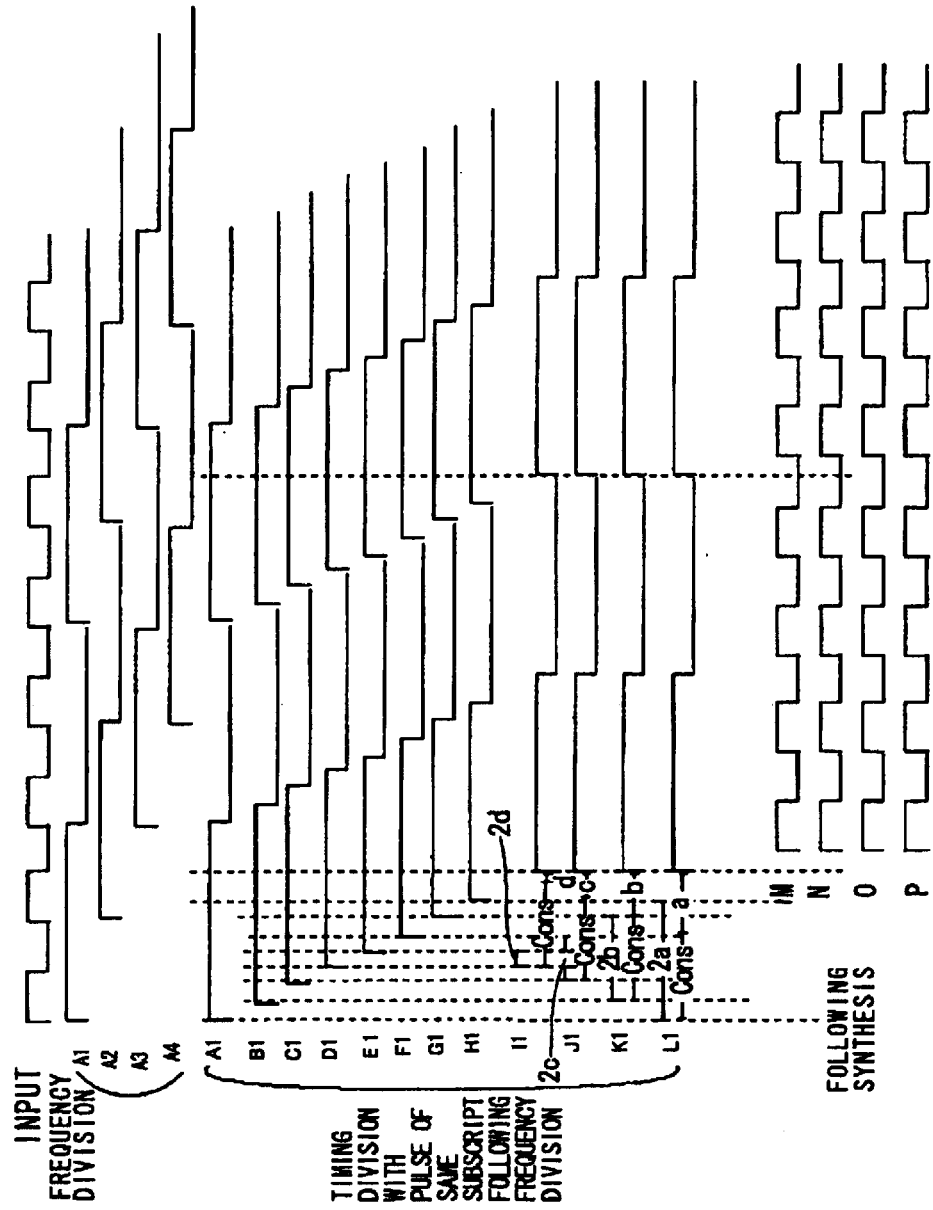
FIG. 20 is a timing chart for illustrating the operation of the fifth embodiment of the present invention.

Referring to FIGS. 19 and 20, a fifth embodiment of the present invention is explained. In the present embodiment the present invention is applied to a configuration in which the delay magnitude on the clock propagation path is longer than the clock period tCK.

Referring to FIG. 19, showing the fifth embodiment of the present invention, input clocks 13 are frequency divided by the frequency dividing circuit 14, and multi-phase (four-phase) clocks output by the frequency dividing circuit 14 are output into clock wirings 11-1 to 11-4. The clock wirings equal in number to the number of phases of the clocks are direction-reversed to serve as bi-directional clock transmission lines. The timings of the clocks on the wirings of the each phases are averaged, using the timing averaging circuit (TM), and subsequently synthesized in the synthesis circuit 16.

The present fifth embodiment includes four timing averaging circuits (TM), fed with signals on paired points A1 to A4 on the forward route and on paired points H1 to H4 on the return route of the same clock propagation paths 11-1 to 11-4 to generate output signals L1 to L4, a synthesis circuit 16, for synthesizing the L1 to L4 to generate an output signal P, four timing averaging circuits (TM), fed with signals on paired points B1 to B4 on the forward route and on paired points G1 to G4 on the return route of the same clock propagation paths 11-1 to 11-4 to generate output signals K1 to K4, a synthesis circuit $16_2$ for synthesizing the K1 to K4 to generate an output signal O, four timing averaging circuits (TM), fed with signals on paired points C1 to C4 on the forward route and on paired points F1 to F4 on the return route of the same clock propagation paths 11-1 to 11-4 to generate output signals J1 to J4, a synthesis circuit $16_3$ for synthesizing the J1 to J4 to generate an output signal N, four timing averaging circuits (TM), fed with signals on paired points D1 to D4 on the forward route and on paired points E1 to E4 on the return route of the same clock propagation paths 11-1 to 11-4 to generate output signals I1 to I4, and a synthesis circuit $16_4$ for synthesizing the I1 to I4 to generate an output signal M. In the present embodiment the outputs M to P are phase-matched relative to one another.

In the present embodiment, similarly to the above-described fourth embodiment, the delay magnitude of the clock path can be matched solely by the timing averaging circuit, without using the multiplexing circuit, in a case wherein the delay magnitude on the clock propagation path is longer than the clock period. In the above-described fourth embodiment, the timing averaging circuits provided with the frequency dividing function are provided with two frequency dividing circuits. In the present embodiment, provided with the frequency dividing circuit 14 for frequency dividing the input clocks 13 to furnish the resulting frequency divided clocks to the four clock propagation paths 11-1 to 11-4, the delay magnitudes of the clock paths can be matched with a smaller number of frequency dividing circuits. That is, although the number of wirings for the clock propagation paths is increased, the circuit scale can be reduced as compared to that in the fourth embodiment.

A sixth embodiment of the present invention is explained with reference to FIG. 21. The present sixth embodiment uses a timing averaging circuit TM and two layers of the clock pulse timing averaging circuits to furnish the clock propagation path in a mesh-like fashion. Referring to FIG. 21, timing averaging circuits $110_1$ to $110_4$ for averaging the timings at preset points on the forward and return routes of the clock propagation path 111 adapted for propagating the clocks from the input buffer 112 are provided on one side of a chip. A plurality of circuits for averaging the clock pulse timings, fed with outputs of buffers $113_1$ to $113_4$, fed in urn with outputs of the timing averaging circuit $110_1$ to $110_4$, are arranged in parallel from the wirings corresponding linearly in timing, and outputs are connected in a meshed fashion.

In the present sixth embodiment, clock signals can be supplied in which the delay magnitudes on the clock path are corresponding on the entire chip in a two-dimensional fashion in a semiconductor integrated circuit. That is, the clock timing supplied to the clock-using circuitry, such as synchronization circuit, on the entire chip area can be matched, no mater where the clock using circuitry is arranged on the chip layout surface.

In the timing averaging circuit of the sixth embodiment of the present invention, employing the circuit components similar to those of the fourth embodiment, it is possible to cope with a configuration in which the delay magnitude of the clock path is longer than the clock period.

According to the present invention, as described above, the phases of the clocks furnished in the internal circuit of the semiconductor integrated circuit furnished with clocks can be matched in phase in a short time and is suitably used for clock synchronization control in a large-scale integrated circuit. Moreover, the present invention can be applied to clock control of a substrate or a variety of devices without being limited to the semiconductor integrated circuit.

The meritorious effects of the present invention are summarized as follows.

According to the present invention, as described above, there may be provided a circuit in which the wiring delay in a direction-reversed bi-directional clock propagation path to eliminate the delay difference on the clock transmission line in its entirety, wherein the delay difficult may be eliminated in a shorter time.

The reason is that the timing is corresponding using a timing averaging circuit without using PLL or DLL to overcome the problem that a long clock cycle is needed until elimination of the delay difference.

According to the present invention, the circuit scale may be prevented from being increased.

The reason is that, in the present invention, phase comparators or concatenated delay circuits are eliminated in contradistinction from the conventional apparatus provided with plural phase comparators or plural concatenated delay circuits etc.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A clock controlling circuit comprising:
   a frequency dividing circuit for frequency dividing input clocks for outputting frequency divided multi-phase clocks of plural different phases;
   a plurality of clock propagation paths for receiving at one end with a plurality of frequency divided clocks output from said frequency dividing circuit;
   a plurality of timing averaging circuits for receiving two clocks from a first position on a forward route and from a second position on a return route corresponding to said first position, for each of said plural clock propagation paths, each to output an output signal of delay time corresponding to a time resulting from division of a timing difference of said two clocks into two equal portions, respectively; and
   a synthesis circuit for synthesizing plural outputs of said plural timing averaging circuits.

2. The clock controlling circuit of claim 1, wherein at least one of said timing averaging circuits is configured to issue said output signal with a first delay time corresponding to a delay time until said output signal is issued after one of said two clocks undergoing transition at an earlier time point is input simultaneously to first and second inputs of said two clocks, added with a second delay time corresponding to a time obtained on equally dividing the timing difference T of said two clocks (T/2).

3. The clock controlling circuit of claim 1, wherein at least one of said timing averaging circuits is arranged for charging or discharging an internal node based on one of said two input clocks undergoing transition at an earlier time and for charging or discharging said internal node based on the other clock undergoing transition with a delay time from said one clock, and on said one clock;
   said clock controlling circuit further comprising a buffer circuit connected to an input end thereof to said internal node and whose output logical value is changed when said internal node voltage exceeds or falls below a threshold voltage.

4. The clock controlling circuit of claim 1, wherein at least one of said timing averaging circuits comprises:
   first and second switch elements connected in parallel across a first power source and an internal node for being turned on and off when the first and second inputs are at first and second values, respectively;
   a third switch element connected across said internal node and a second power source, said third switch element being fed with said first and second inputs and being turned on when said third switch element is at said second value;
   a capacitance connected across said internal node and said second power source; and
   a buffer circuit an output logical value of which is determined based on the relative magnitudes of the potential of said internal node and a threshold value.

5. The clock controlling circuit of claim 1, wherein at least one of said timing averaging circuits comprises:
   a plurality of first switch elements each connected in series across a first power source and an internal node, said first switch elements having control terminals fed with a first input and being turned off when said first input is at a first value;
   a plurality of second switch elements each connected in series across said internal node and a second power source, each second switch element having its control terminal connected to said first input and being turned on when said first input is at a first value;
   a third switch element and a fourth switch element connected in series across said first power source and said internal node, said third switch element having its control terminal connected to said first input, and being turned off when said first input is at a first value, and said fourth switch element having its control terminal connected to said second input and being turned off when said second input is at a first value;
   a fifth switch element and a sixth switch element connected in series across said internal node and said second power source, said fifth switch element having its control terminal connected to said second input, and being turned on when said second input is at a first value, and said sixth switch element having its control terminal connected to said first input and being turned on when said first input is at said first value; and
   an inverter circuit an output logical value of which is determined based on relative magnitudes of said internal node and a threshold value.

6. The clock controlling circuit as defined in claim 5, wherein a switch element having its control terminal connected to said first input is connected to said first power source, a switch element having its control terminal connected to said second input is connected to said second power source, and wherein the numbers of the switch elements operating as loads for said first and second inputs are equal to each other.

7. The clock controlling circuit of claim 1, wherein at least one of said timing averaging circuits comprises:

a first switch element, connected across said first power source and a first internal node;

a first logical circuit fed with first and second input signals and having its output end connected to a control terminal of said first switch element, said first switch element being turned on when both said first and second input signals are at a first value;

a second switch element and a third switch element connected in series across said first internal node and the second power source, said second switch element being turned off or on when said first input signal is at said first or second value, respectively, said third switch element being turned on or off when the output signal is at said first or second value, respectively;

a fourth switch element and a fifth switch element connected in series across said first internal node and the second power source, said fourth switch element being turned off or on when said second input signal is at said first or second value, respectively, and said fifth switch element being turned on or off when the output signal is at said first or second value, respectively;

a sixth switch element connected across said first power source and a third internal node for inputting said first internal node to a control terminal;

a seventh switch element connected across said second power source and a second internal node;

a second logical circuit fed with first and second input signals and having its output end connected to a control terminal of said seventh switch element, said seventh switch element being turned on when both said first and second input signals are at a second value;

an eighth switch element and a ninth switch element connected in series across said second internal node and the first power source, said eighth switch element being turned on or off when said first input signal is at said first or second value, respectively, said ninth switch element being turned off or on when the output signal is at said first or second value, respectively;

a tenth switch element and an eleventh switch element connected in series across said second internal node and the first power source, said tenth switch element being turned on or off when said second input signal is at said first or second value, respectively, and said eleventh switch element being turned off or on when said output signal is at said first or second value, respectively;

a twelfth switch element connected across said second power source and said third internal node for inputting said second internal node to a control terminal; and an inverter circuit having its input terminal fed with said third internal node and an output logical value of which is determined by the relative magnitudes of said third internal node potential and a threshold value; and wherein the clock control circuit further comprises:

a circuit means for on/off—controlling a first switch element pair made up of said third switch element and the fifth switch element and a second switch element pair made up of said ninth switch element and the eleventh switch element.

8. The clock controlling circuit of claim 1, wherein at least one of said timing averaging circuits comprises:

a first switch element connected across said first power source and a first internal node;

a first logical circuit fed with first and second input signals and having its output end connected to a control terminal of said first switch element, said first switch element being turned on when both said first and second input signals are at a first value;

a second switch element and a third switch element connected in series across said first internal node and the second power source, said second switch element being turned off or on when said first input signal is at said first or second value, respectively, said third switch element being turned on or off when the output signal is at said first or second value, respectively;

a fourth switch element and a fifth switch element connected in series across said first internal node and the second power source, said fourth switch element being turned off or on when said second input signal is at said first or second value, respectively, said fifth switch element being turned on or off when the output signal is at said first or second value, respectively;

a sixth switch element connected across said first power source and a third internal node for inputting said first internal node to a control terminal;

a seventh switch element connected across said second power source and a second internal node;

a second logical circuit fed with first and second input signals and having its output end connected to a control terminal of said seventh switch element, said seventh switch element being turned on when both said first and second input signals are at a second value;

an eighth switch element and a ninth switch element connected in series across said second internal node and the first power source, said eighth switch element being turned on or off when said first input signal is at said first or second value, respectively, said ninth switch element being turned off or on when an output signal is at said first or second value, respectively;

a tenth switch element and an eleventh switch element connected in series across said second internal node and the first power source, said tenth switch element being turned on and off when said second input signal is at said first or second value, respectively, said eleventh switch element being turned off or on when said output signal is at said first or second value, respectively;

a twelfth switch element connected across said second power source and said third internal node for inputting said second internal node to a control terminal; and an inverter circuit having its input terminal fed with said third internal node and an output logical value of which is determined by the relative magnitudes of said third internal node potential and a threshold value, wherein said output signal is issued from an output end of said inverter circuit, and wherein an output of a buffer circuit generating a normal output of said output signal is connected in common to control terminals of said third switch element, said fifth switch element, said ninth switch element and said eleventh switch element.

9. The clock controlling circuit of claim 1, wherein at least one of said timing averaging circuits comprises:
- a first switch element connected across said first power source and a first internal node;
- a first logical circuit fed with first and second input signals and having its output end connected to a control terminal of said first switch element, said first switch element being turned on when both said first and second input signals are at a first value;
- second and third switch elements connected in series across said first internal node and a second power source, said second switch element being turned off or on when said first input signal is at said first or second value, respectively;
- fourth and fifth switch elements connected in series across said first internal node and second power source, said fourth switch element being turned off or on when said second input signal is at said first or second value, respectively;
- a sixth switch element connected across said first power source and a third internal node for inputting said first internal node to a control terminal;
- a seventh switch element connected across said second power source and a second internal node;
- a second logical circuit fed with first and second input signals and having its output end connected to a control terminal of said seventh switch element, said seventh switch element being turned on when both said first and second input signals are at a second value;
- eighth and ninth switch elements connected in series across said second internal node and said first power source, said eighth switch element being turned on or off when said first input signal is at said first or second value, respectively;
- tenth and eleventh switch elements connected in series across said second internal node and said first power source, said tenth switch element being turned on or off when said second input signal is at said first or second value, respectively; and
- a twelfth switch element connected across said second power source and said third internal node for inputting said second internal node to a control terminal; and
- an inverter circuit having its input terminal fed with said third internal node, and an output logical value of which is determined by the relative magnitudes of said third internal node potential and a threshold value;
- an output of said first logical circuit being connected to control terminals of said ninth and eleventh switch elements;
- an output of said second logical circuit being connected to control terminals of said third and fifth switch elements.

10. A clock controlling circuit comprising:
- means for frequency dividing input clocks for outputting frequency divided multi-phase clocks of plural different phases;
- a plurality of means for receiving at one end with a plurality of frequency divided clocks output from said means for frequency dividing input clocks;
- means for receiving two clocks from a first position on a forward route and from a second position on a return route corresponding to said first position, for each of said means for receiving, outputting an output signal of delay time corresponding to a time resulting from division of a timing difference of said two clocks into two equal portions, respectively; and
- means for synthesizing plural outputs of said means for receiving two clocks.

11. A method for controlling a clock comprising:
- frequency dividing input clocks for outputting frequency divided multi-phase clocks of plural different phases;
- receiving said frequency divided multi-phase clocks of plural different phases at one end of a plurality of clock propagation paths;
- receiving two clocks from a first position on a forward route and from a second position on a return route corresponding the first position;
- outputting an output signal of a delay time corresponding to a time resulting from a division of a timing difference of said two clocks into two equal portions, respectively; and
- synthesizing plural outputs of said plural timing averaging circuits.

* * * * *